(12) United States Patent
Johns et al.

(10) Patent No.: US 11,506,815 B2
(45) Date of Patent: Nov. 22, 2022

(54) METHOD FOR IMPROVED RECOVERY IN ULTRA-TIGHT RESERVOIRS BASED ON DIFFUSION

(71) Applicant: The Penn State Research Foundation, University Park, PA (US)

(72) Inventors: Russell T. Johns, University Park, PA (US); Hamid Emami-Meybodi, University Park, PA (US); Michael Cronin, University Park, PA (US)

(73) Assignee: The Penn State Research Foundation, University Park, PA (US)

( * ) Notice: Subject to any disclaimer, the term of this patent is extended or adjusted under 35 U.S.C. 154(b) by 102 days.

(21) Appl. No.: 16/979,630

(22) PCT Filed: Mar. 15, 2019

(86) PCT No.: PCT/US2019/022390
§ 371 (c)(1),
(2) Date: Sep. 10, 2020

(87) PCT Pub. No.: WO2019/178432
PCT Pub. Date: Sep. 19, 2019

(65) Prior Publication Data
US 2021/0165126 A1     Jun. 3, 2021

Related U.S. Application Data

(60) Provisional application No. 62/643,367, filed on Mar. 15, 2018.

(51) Int. Cl.
*G01V 99/00*     (2009.01)
*G06F 30/20*     (2020.01)
(Continued)

(52) U.S. Cl.
CPC ............ *G01V 99/005* (2013.01); *E21B 43/16* (2013.01); *E21B 43/26* (2013.01); *E21B 47/06* (2013.01);
(Continued)

(58) Field of Classification Search
CPC .......... G01V 99/005; G01V 2210/624; G01V 2210/663; G06F 30/20; G06F 17/40;
(Continued)

(56) References Cited

U.S. PATENT DOCUMENTS

2006/0224369 A1    10/2006    Yang et al.
2007/0118346 A1    5/2007    Wen et al.
(Continued)

OTHER PUBLICATIONS

Sun, Jianlei, et al. "Numerical simulation of CO2 huff-n-puff in complex fracture networks of unconventional liquid reservoirs." Journal of Natural Gas Science and Engineering 31 (2016). pp. 481-492. (Year: 2016).*
(Continued)

*Primary Examiner* — John E Johansen
(74) *Attorney, Agent, or Firm* — Troutman Pepper Hamilton Sanders LLP; Christopher C. Close, Jr.; Nicholas H. Doss

(57) ABSTRACT

A method for improved prediction and enhancement of hydrocarbon recovery from ultra-tight/unconventional reservoirs for both the primary production and any subsequent solvent huff'n'puff periods based on facilitating the diffusion process may include steps of defining one or more initial properties of a reservoir and integrating characterization data of the reservoir; defining a wellbore trajectory for each of at least one well and one or more parameters associated with a completion/reservoir stimulation design; specifying operating conditions for a current development cycle; performing diffusion-based dynamic fracture/reservoir simulation for calculating hydrocarbon recovery and efficiency of
(Continued)

a hydrocarbon process; and; determining whether to commence or continue enhanced oil recovery (EOR) or enhanced gas recovery (EGR) cycles.

19 Claims, 11 Drawing Sheets

(51) Int. Cl.
| | |
|---|---|
| E21B 43/16 | (2006.01) |
| E21B 43/26 | (2006.01) |
| E21B 47/06 | (2012.01) |
| E21B 49/00 | (2006.01) |
| G06T 17/05 | (2011.01) |
| E21B 47/00 | (2012.01) |
| G01N 7/00 | (2006.01) |
| G06F 17/40 | (2006.01) |

(52) U.S. Cl.
CPC .............. *E21B 49/00* (2013.01); *G06F 30/20* (2020.01); *G06T 17/05* (2013.01); *E21B 43/168* (2013.01); *E21B 47/00* (2013.01); *E21B 2200/20* (2020.05); *G01N 7/00* (2013.01); *G01V 2210/624* (2013.01); *G01V 2210/663* (2013.01); *G06F 17/40* (2013.01)

(58) Field of Classification Search
CPC .......... E21B 43/16; E21B 43/26; E21B 47/06; E21B 49/00; E21B 2200/20; E21B 43/168; E21B 47/00; G06T 17/05; G01N 7/00

USPC ........................................................... 703/10
See application file for complete search history.

(56) References Cited

U.S. PATENT DOCUMENTS

| | | |
|---|---|---|
| 2012/0179443 A1 | 7/2012 | Van Batenburg et al. |
| 2016/0145977 A1 | 5/2016 | Chugunov et al. |
| 2017/0159416 A1 | 6/2017 | Sheng |
| 2018/0347328 A1* | 12/2018 | Aguilera ................. E21B 43/18 |

OTHER PUBLICATIONS

Cronin, Michael, Hamid Emami-Meybodi, and Russell T. Johns. "Diffusion-dominated proxy model for solvent injection in ultratight oil reservoirs." SPE Journal 24.02 (2019). pp. 660-680. (Year: 2019).*

International Search Report and Written Opinion for PCT Application No. PCT/US2019/022390 dated May 30, 2019.

Kurtogu, "Integrated reservoir characterization and modeling in support of enhanced oil recovery for Bakken " Coloradco School of Mines, 2013, p. 1-239.

Yu, "Simulation study of huff-n-puff air injection for enhanced oil recovery in shale oil reservoirs." SPE Western North American and Rocky Mountain Joint Meeting, Apr. 17-18, Denver, Colorado, Society of Petroleum Engineers 2014, Abstract p. 3-5.

* cited by examiner

METHOD FOR IMPROVED RECOVERY IN ULTRA-TIGHT RESERVOIRS BASED ON DIFFUSION

CROSS-REFERENCE TO RELATED PATENT APPLICATION

This application claims the benefit of U.S. Provisional Patent Application No. 62/643,367 filed Mar. 15, 2018, the entire disclosure of which is hereby incorporated by reference herein.

TECHNICAL FIELD

The present disclosure is in the field of oil and gas production and is more specifically directed to the prediction and enhancement of hydrocarbon recovery from ultra-tight unconventional reservoirs.

BACKGROUND

Unconventional tight (e.g., tight sands, siltstones, and carbonate) and ultra-tight (e.g., shales) hydrocarbon reservoirs represent more than 50% and 70% of daily U.S. oil and gas productions, respectively. However, the primary recovery from these reservoirs ranges from 3 to 10% for the oil plays and from 10 to 20% for the gas plays. Over the last few years, interest has grown in evaluating the viability of solvent (such as $CO_2$ and $N_2$ among many others) injection to enhance hydrocarbon recoveries in these reservoirs. Continuous solvent flooding is impractical since the injected solvent cannot drive oil out of the matrix from one well to another, except possibly through a high-permeability conduit such as a fracture. Thus, a cyclic approach like huff'n'puff is needed. Although solvent-injection is a well-established method to improve hydrocarbon recovery from conventional reservoirs, very little is known on fundamental aspects related to the transport of the injected solvent in ultra-tight reservoirs that contain inorganic and organic nanometer-scale pores. The term "solvent" appearing in this invention is usually referred to as "gas" in the petroleum literature or "co-solvent" in chemical engineering literature.

There has been an unsettled problem; prediction and enhancement of hydrocarbon recovery from ultra-tight reservoirs. Forecasting hydrocarbon recovery for both the primary production and any subsequent huff'n'puff periods from ultra-tight reservoirs entails uncertainty, but the technology currently uses conventional modeling approaches based on convective transport with Darcy's law. There is no physical justification for using Darcy's law, but it is likely being used only because it has been used for decades. All fluid types are covered by this patent including gas, gas condensates, and oil.

The huff'n'puff process consists of three distinct phases. In the "huff" phase, solvent is injected into the reservoir and rapidly travels through the fracture network. Following the "huff" period, the injection well is shut-in to allow solvent to penetrate by diffusion into the matrix and mix with reservoir oil during a "soak" interval. Mass transfer of solvent slug components into the reservoir oil may cause the oil phase to swell and reduce viscosity, although viscosity changes are irrelevant in a diffusion process except for its effect on the value of the diffusion coefficient. After sufficient soaking time, the injection well is re-opened at low pressure to produce solvent and solvent-rich oil phase. Although the injected fluid is usually referred to as "gas" in the literature, the injected fluid is often supercritical (Lake et al. 2014); hence the term solvent here. Transport in the soak and puff periods is likely dominated by diffusion, not convection, owing to ultra-low permeability in shale reservoirs (Hawthorne et al. 2013).

EOG Resources, Inc. reported a 30%-50% increase in ultimate oil recovery compared to primary production based on several EOR field trials with cyclic solvent injection in the South Texas Eagle Ford (Rassenfoss 2017). Full public details are scarce, especially on the soaking period, but EOG's press release is encouraging because it demonstrates that solvent HUFF'N'PUFF could be commercial and technically viable in the Eagle Ford shale oil reservoir. Field trials in other ultra-tight (North Dakota Bakken) and tight (Canadian Bakken) oil reservoirs confirm oil production rate increases following a $CO_2$ soaking period (Alfarge, Wei, and Bai 2017a). Laboratory experiments also reveal significant potential for HUFF'N'PUFF as an FOR strategy in shale oil reservoirs. For example, North Dakota Bakken laboratory experiments gave very high oil recoveries of ~60-90% OOIP for samples surrounded by produced gas (Sorensen et al. 2014, Hawthorne et al. 2013, Hawthorne et al. 2017). High laboratory recoveries were also reported using $CO_2$ with Eagle Ford and Mancos Shale cores (Gamadi et al. 2014) and $CH_4$ with Permian-Wolfcamp cores (Li and Sheng 2016). Solvent injection from an injector to a producer has also been done in tight reservoirs (but not ultra-tight reservoirs), such as the Bakken. Todd and Evans (2016) for example reviewed IOR pilots in the Bakken Formation and concluded that conformance control (water/gas breakthrough), not injectivity, within the fractured reservoir was the primary operational challenge limiting the success of multi-well configurations.

Standard practice is to calculate the minimum miscibility pressure (MMP) required for dynamic miscibility in both conventional (Lake et al. 2014, Stalkup 1983) and tight/ultra-tight oil reservoirs (Luo, Luo, and Li 2017, Zuloaga-Molero et al. 2016, Yu, Lashgari, and Sepehrnoori 2014). The traditional MMP concept, however, is based on the presumption of advection-dominated transport (using Darcy's law) within the matrix and the absence of large capillary pressures in phase equilibrium equations. Thus, the Peclet number ($N_{Pe}$=vL/D) for these conventional solvent floods is large so that the time scale for transport by diffusion a distance L is very long compared to the time scale for transport by convection for the same distance. Miscibility for these processes is often developed in a multi-contact miscible process (MCM) where composition paths are twisted towards a critical point by convective flow. By definition, MMP is the injection pressure above which changes in incremental oil recovery become relatively small; a more strict definition for MMP is the injection pressure where recovery is 100% in the absence of diffusion.

There is increasing recognition, however, of a discrepancy between the traditional MMP concept and observed behaviors in tight rocks with respect to recovery. Li et al. (2017) found that oil recovery increased for $CO_2$ huff'n'puff in Wolfcamp shale cores at pressures above slimtube MMP. Hawthorne et al. (2017) found that oil recovery from Bakken samples using $CO_2$ continued to improve at pressures two to three times the MMP derived from capillary rise values and concluded that the "strong reliance on $CO_2$ pressure for the recovery of higher molecular weight hydrocarbons supports proposed solubility/diffusion mechanisms." Gamadi et al. (2014) observed that $CO_2$ miscibility in shale oil experiments was more important than excess soaking pressure above MMP. Solano, Johns, and Lake (2001) showed that increasing levels of gas-oil mixing could mask the MMP requiring an increase in the slug size or pressure above the MMP to compensate for the impact of mixing on displacement efficiency. Experimental results by Adel et al. (2018) reveal that MMP is irrelevant based on progressively increasing oil recovery factor values versus pressure using $CO_2$ with Wolfcamp cores.

Numerous experiments support the important role of diffusion in shales (Yu and Sheng 2016, Wan, Yu, and Sheng 2015, Gamadi et al. 2014, Hawthorne et al. 2013, Ferns et al. 2015) and low-permeability chalks (Ghasemi et al. 2017, Darvish et. al. 2006, Eide et al. 2016, Morel et al. 1993). Further, transport by diffusion is an important recovery mechanism in fractured reservoirs, especially those with low matrix permeability for oil (Morel et al. 1993, da Silva and Belery 1989, Hoteit and Firoozabadi 2009, Grogan et al. 1988, Mohebbinia and Wong 2017, Sherafati and Jessen 2018, Riazi, Whitson, and da Silva 1994) and gases (Carlson and Mercer 1991, Kolesar, Ertekin, and Obut 1990a, b, Amann-Hildenbrand, Ghanizadeh, and Krooss 2012). In contrast, Olorode et al. (2017) concluded that advection dominates transport in the inorganic matrix of gas shale reservoirs with permeability greater than 10 nD. Their conclusion, however, was based on large elements in their finite-element model that likely reduced the influence of a small value of diffusion. In addition to physical (molecular) diffusion, mass transport models based on anomalous diffusion (Albinali and Ozkan 2016, Raghavan and Chen 2013, Raghavan and Chen 2016) have been proposed for ultra-tight oil reservoirs. 1-D field-scale models have been proposed for shale gas reservoirs (Walton and McLennan 2013, Patzek, Male, and Marder 2013) and shale oil reservoirs (Patzek, Saputra, and Kirati 2017) based on a non-linear pressure diffusion equation with recovery proportional to the square root of time. Dejam et al. (2017) illustrate how the predominance of "pre-Darcy" transport conditions can over predict fluid flux within tight mudrocks/shales using Darcy's law.

SUMMARY OF THE DISCLOSURE

The key problem solved is to propose that diffusion dominates transport of components (oil, gas, or injected solvent) in ultra-tight reservoirs, such as shale reservoirs. A new and different approach based on 100% diffusion-dominated transport conditions within the matrix is considered to predict field-scale recovery for both the primary production period and any subsequent huff'n'puff process in the ultra-tight reservoirs. All other processes, such as oil swelling, capillary imbibition, adsorption, and other suggested mechanisms are secondary to the diffusion process. The fluid transport in ultra-tight rock is proposed to be a diffusion process, which must be modeled based on Fick's law, or some other non-Fickian relation yet to be determined, instead of the commonly used Darcy's law. The implication is important as the mechanism for hydrocarbon recovery would be based solely on density and concentration gradients. Although, the form of the equations for transport for both Fick's and Darcy's law are similar, the mechanism for transport is completely different: hydraulic conductivity (permeability) and pressure gradients control transport in Darcy's law, while molecular diffusion coefficient and effective density gradients control transport in Fick's law. Thus, any process that increases the diffusion coefficient and/or the effective density gradient (for a fixed fracture network) will accelerate recovery.

By understanding the mechanism, technologies described in this invention to increase the diffusion coefficient, or to increase the "effective density" gradient. The effective density is defined as the product of the fluid density and component mole fraction. Cubic EOS (Peng-Robinson EOS) are used to calculate fluid densities. Recovery can be accelerated significantly by injection and soaking of solvent to change the concentration of the fluid in the matrix, while also decreasing the density in the well (pressure decrease). Other techniques, such as increasing the temperature could also increase the diffusion coefficient, and change density. A temperature increase could easily be done through resistive heating.

The mechanism also leads clearly to the type of fractures that should be generated. Thus, there are five major ways to increase recovery: (1) increase the total area of contact between the matrix and the well by creating hydraulic fractures (HF) and reactivation of natural fractures, (2) generate HF that minimize intersections, while keeping the contact area large, (3) increase the diffusion coefficient by choosing a solvent(s) with higher diffusivity or increasing temperature of the injected solvent, (4) increase the effective density gradient by choosing an appropriate solvent(s) or increase drawdown, and (5) find optimal solvent injection (or similar EOR methods) designs ensuring high-density difference between matrix and fractures.

The technology shown in the present disclosure allows for the prediction of ultimate recoveries for any fluid. Ultimate recoveries are astonishing low for oil shale reservoirs but increase substantially for dry gas shale reservoirs. The underlying physics shows that hydraulic fractures increase the contact area, which substantially increases the transport by diffusion. Production type curves can be provided for oil, condensate, and gas shale reservoirs. The "hockey stick" recovery trends with time are predicted, eliminating the need for the cumbersome and unscientific decline analysis currently being done.

The proposed methods in the present disclosure will be a major revelation for the industry and will allow for two or three times increased recoveries from these oil reservoirs. The proposed methods also apply to ultra-tight condensate and gas reservoirs, although improvement in recoveries will be smaller for gases since the density reduction caused by pressure drawdown is already significant during primary production owing to high compressibility of gases. Injection of another gas (such as nitrogen) could aid recovery in some shale gas condensate reservoirs, and possibly also for gas shale reservoirs. This invention is particularly relevant, but is not limited, to the U.S. vast shale resources and its implications to future economic activity associated with the sustainable development of unconventional reservoirs. It is likely that recoveries can be increased by two to three times in shale oil reservoirs by the proposed techniques, while also showing improvements in shale gas (e.g., Marcellus). Understanding diffusion through ultra-low permeability media in this disclosure also has broad impact on numerous applications such as designing long-term bedrock radionuclide repositories, predicting outgassing rates in crystalline rocks for different gases (e.g. radon, argon, helium) due to radioactive decay or background crustal flux, projecting the long term durability of cement in $CO_2$ sequestration projects, and understanding the formation of methane hydrates. Additional details of the disclosure are provided below.

The present disclosure can be specifically directed to the improved prediction and enhancement of hydrocarbon recovery from ultra-tight unconventional reservoirs for both the primary production and any subsequent solvent huff'n'puff periods based on facilitating the self-diffusion process for primary and the counter-diffusion process for huff'n'puff. Diffusion coefficients, effective density gradients, and contact area between matrix and fractures control recovery rates, whereas density reduction controls ultimate hydrocarbon recovery as time tends to infinity.

All fluid types can be covered by this disclosure including gas, gas condensates, and oil. The invention provides an efficient, physics-based, method to fit production type curves for oil, condensate, and gas shale reservoirs. Recovery trends with time are predicted, eliminating the need for the cumbersome and unscientific decline analysis currently being done. The invention provides fundamental guidance on realistic maximum values for hydrocarbon recovery based on reservoir properties, reservoir fluid composition, and practical operating conditions. Furthermore, the present disclosure can provide detailed guidance on the selection of solvent composition and solvent amount for a multiple cycle huff'n'puff process to enhance the diffusion and recovery process. The present disclosure can describe thermal methods to improve diffusion coefficients and density reduction and the optimal configuration of a stimulated fracture network.

The present disclosure can claim all forms of mass flux by diffusion (Fickian and/or non-Fickian), and/or, any other mathematical arrangement(s) or combinations thereof resulting in mass-flux with one or more diffusive characteristics. By way of example, and not limitation, flux formulations according to Darcy's law in unconventional reservoirs are diffusive in character by virtue of parameter values appearing in the hydraulic diffusivity group. Thus, practitioners have not circumvented the embodiments of the present disclosure by forcing a fit to observations using an alternative physical, empirical, or ad hoc explanation.

In accordance with an aspect of the present disclosure, a method for improved prediction and enhancement of hydrocarbon recovery from ultra-tight unconventional reservoirs for both primary production and any subsequent solvent huff'n'puff periods may include steps of defining one ormore initial properties of a reservoir and integrating characterization data of the reservoir; defining a wellbore trajectory for each of at least one well and one or more parameters associated with a completion/reservoir stimulation design; specifying operating conditions for a current development cycle; performing diffusion-based dynamic fracture/reservoir simulation for calculating hydrocarbon recovery and efficiency of a hydrocarbon process; and; determining whether to commence or continue enhanced oil recovery (EOR) or enhanced gas recovery (EGR) cycles. The step of performing diffusion-based dynamic fracture/reservoir simulation may include steps of performing an iterative coupling of a step of executing a fluid property module and a step of executing a flow and transport module; and calculating hydrocarbon recovery during the current development cycle or at an end of current development cycle. In the step of executing the fluid property module, a cubic equation of state (EOS) may be used to relate thermodynamic variables to equilibrium properties of phases, the thermodynamic variables comprising at least one of pressure, temperature, or compositions, the properties of phases comprising at least one of density, saturation, or composition. The step of executing the flow and transport module may include calculating time-dependent reservoir properties including at least one of pressure, temperature, saturation, composition, or geomechanics, fluid production, or injection rates at each of the at least one well.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

For better understanding of the present disclosure, and the advantages thereof, reference is now made to the following descriptions taken in conjunction with the accompanying drawings.

Transport interference arises in figure (b) owing to the intersection of the two orthogonal fracture planes, which is distinct from effects caused by transients reaching no-flux boundaries.

Figure 9:
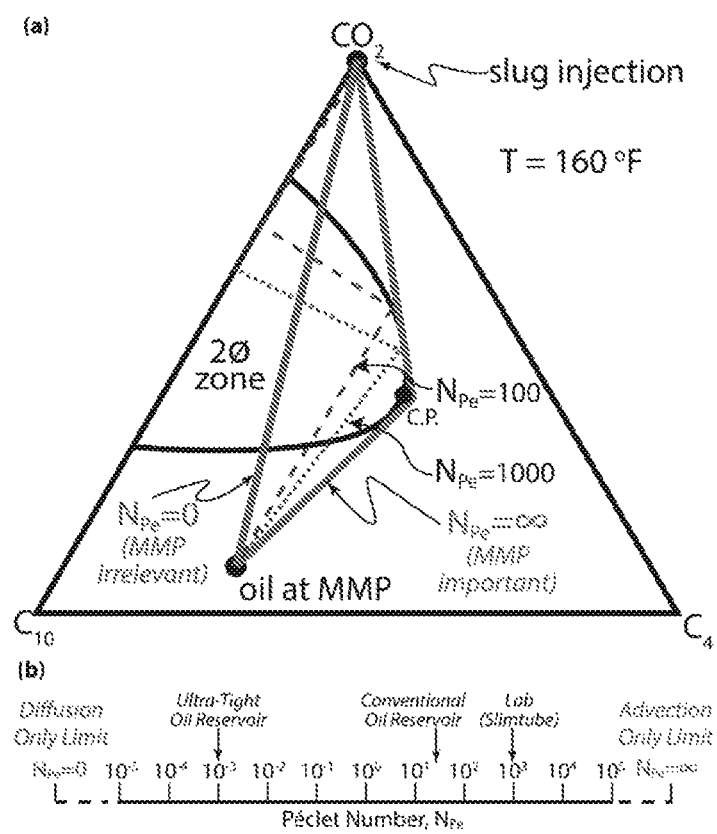

FIG. 9 is a schematic showing (a) ternary plot ($CO_2$—$C_4$-$C_{10}$) illustrating hypothetical composition mixing lines corresponding to a slug injection of $CO_2$ at different $N_{Pe}$ numbers into an oil at the minimum-miscibility-pressure (MMP); and (b) $N_{Pe}$ continuum showing that ultra-tight oil reservoirs are closer to the diffusion end-member than the advection end member.

Figure 10:
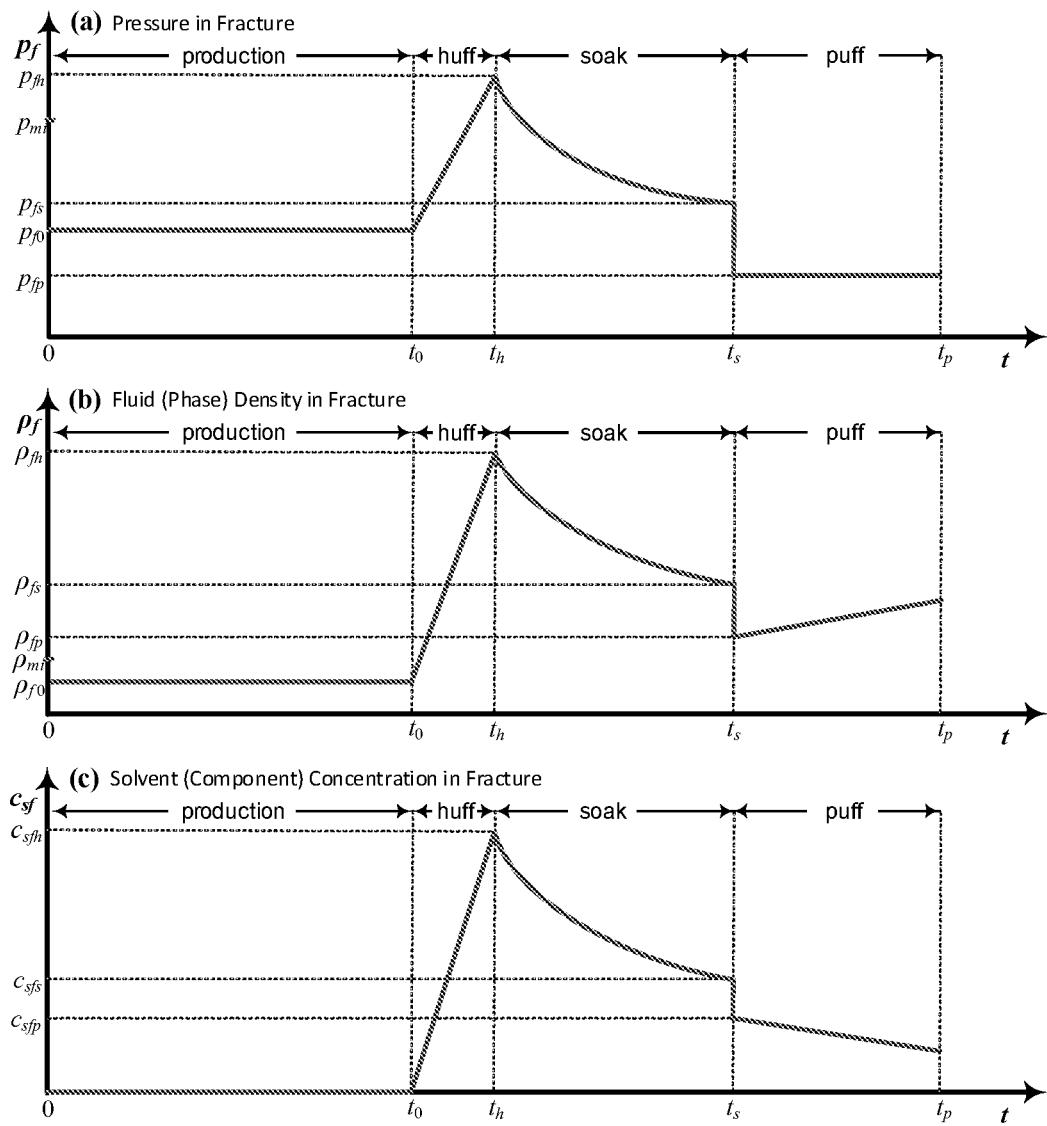

FIG. 10 is an illustration of (a) pressure boundary condition, (b) hydrocarbon density, and (c) solvent mass concentration versus time within fracture network for the primary production ($0 \le t \le t_0$), huff ($t_0 < t \le t_h$), soak ($t_h < t \le t_s$), and puff ($t > t_s$) time intervals. The discontinuous change at the start of the puff period is due to infinite conductivity of the fracture and wellbore.

Figure 11:
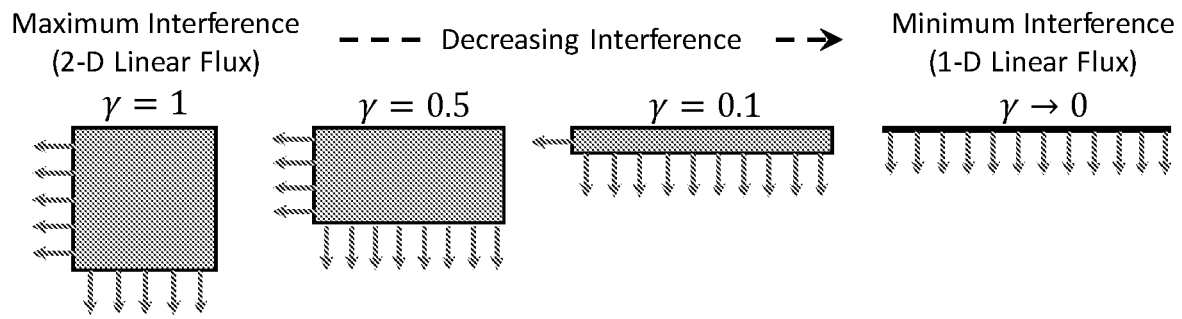

FIG. 11 is a schematic illustrating mass flux interference within matrix occurs near fracture intersections. Interference is maximized for 2-D linear transport when the matrix side-length ratio $\gamma = W/L = 1$ and is minimized as $\gamma$ tends to 0 because the flux contribution of the second fracture plane vanishes and the system behaves in a 1-D linear manner.

Figure 12:
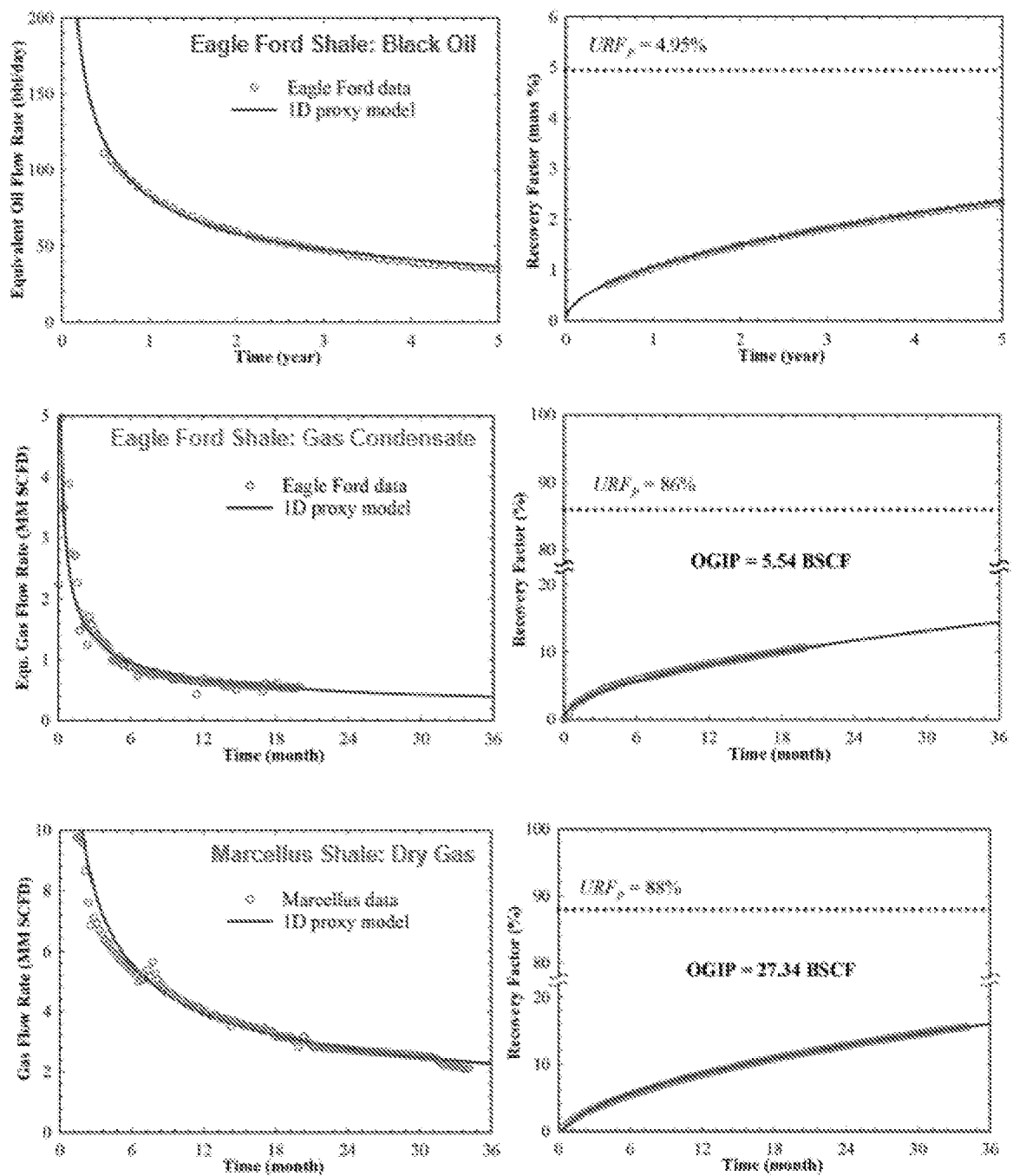

FIG. 12 is a series of diagrams comparing 1-D proxy model production rate and cumulative production to well data for three example shale reservoirs and fluid types.

Figure 13:
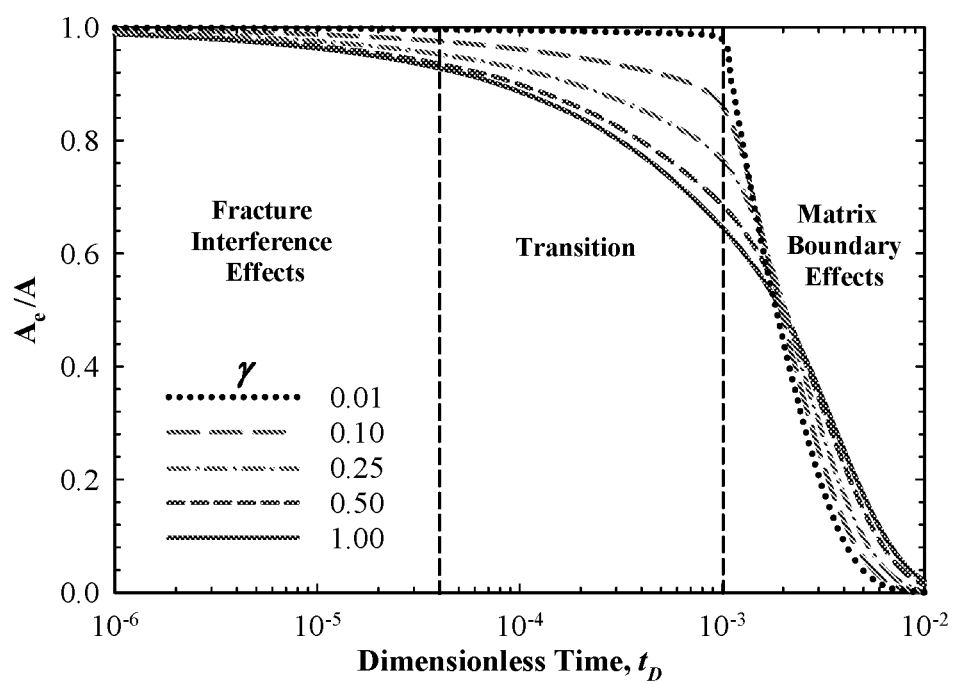

FIG. 13 is a diagram illustrating ratio of effective depletion area to total area ($A_e/A$) versus dimensionless time ($t_D$) for different block aspect ratios ($\gamma = W/L = 1$, 0.5, 0.25, 0.1, 0.01) at a fixed $\psi = 20$. The transition from interference dominated transport to boundary dominated transport conditions is shown as the shaded gray area.

Figure 14:
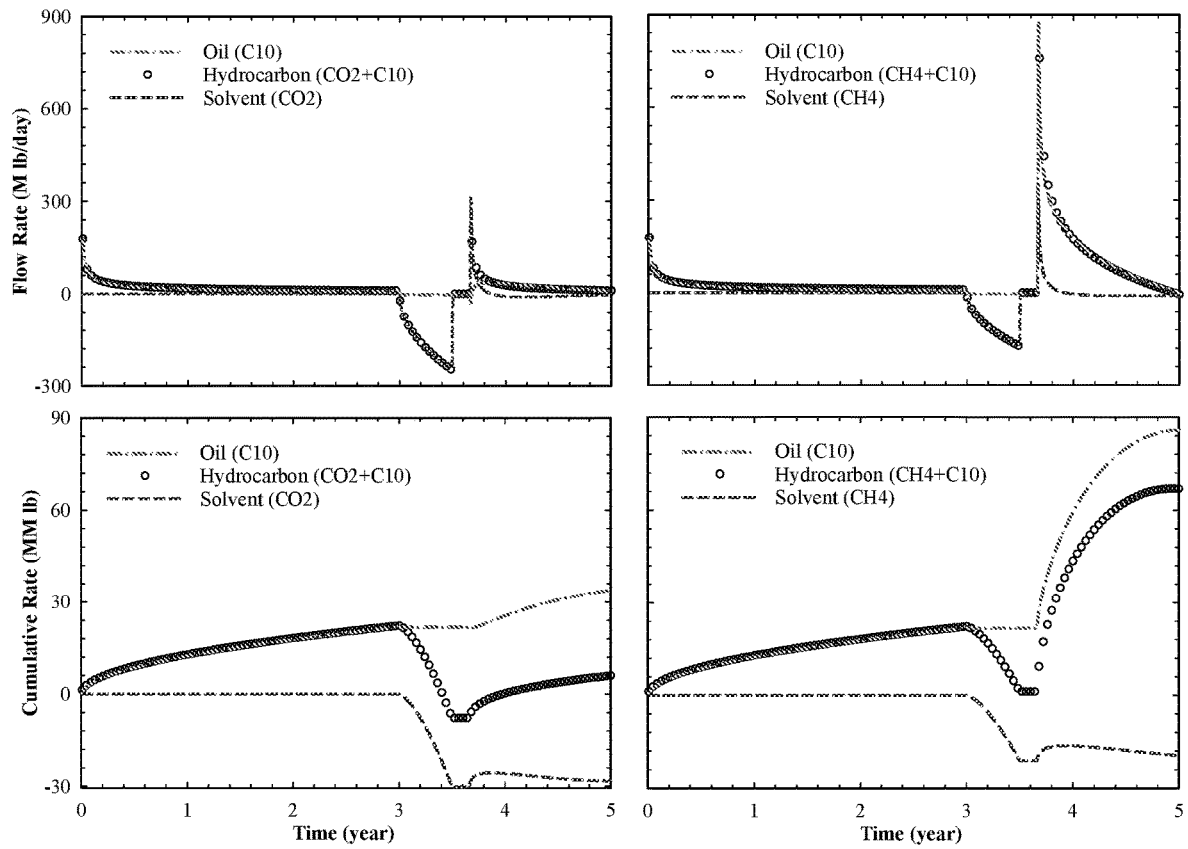

FIG. 14 is a series of diagrams illustrating flow rate and cumulative rate for the $CO_2$—$C_{10}$ to (left plots) and $CH_4$—$C_{10}$ to (right plots) examples observed at the well given in Table 2. Negative values refer to injection. Results generated using 1-D solution.

Figure 15:
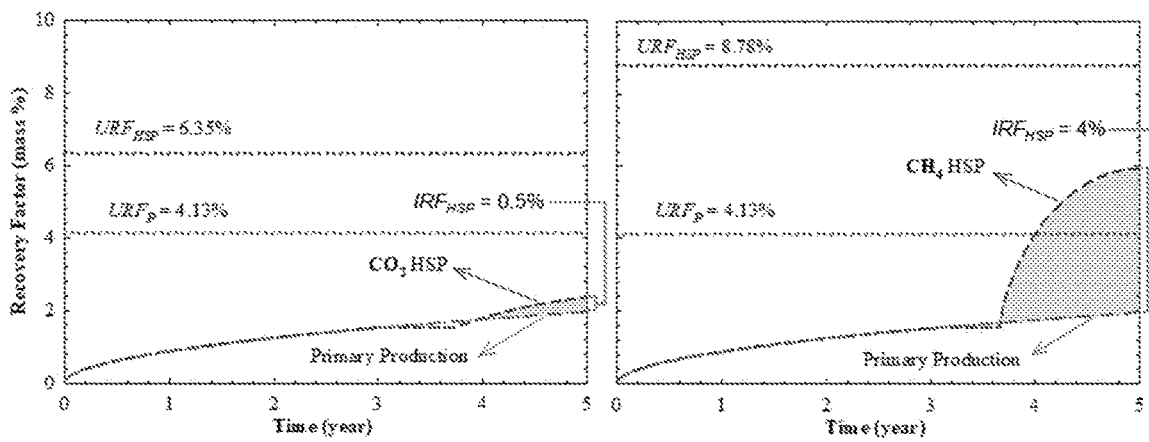

FIG. 15 is a diagram illustrating recovery factors for the examples given in Table 2 using the 1-D proxy model to generate primary production "base case" data (red dashed line) and single cycle of huff'n'puff (dashed blue) following 36 months of production. During a 5-year period, $CO_2$ and $CH_4$ achieved incremental mass recovery factors ($IRF = RF_{HnP} - RF_P$) of about 0.5% and 4%, respectively.

Figure 16:
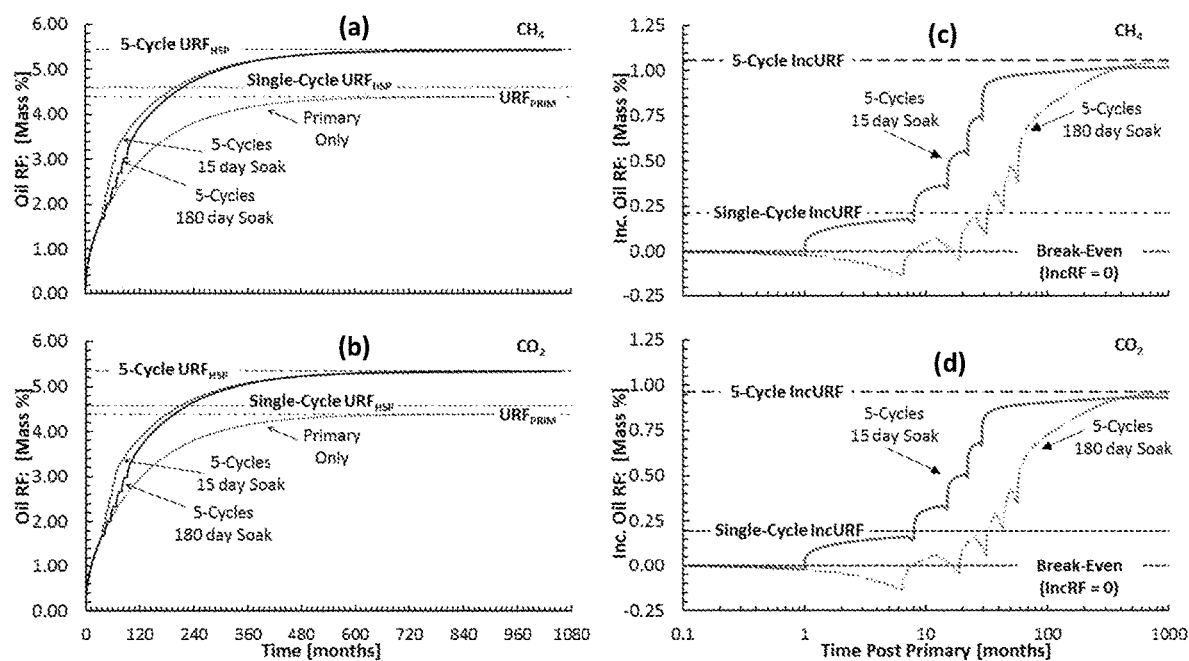

FIG. 16 is a series of diagrams illustrating oil mass recovery factor versus time for $CH_4$-$nC_{10}$ to (a) and $CO_2$-$nC_{10}$ to (b) and incremental oil recovery factor versus months after primary production for $CH_4$-$nC_{10}$ (c) and $CO_2$-$nC_{10}$ to (d). Note that a cross-over occurs in the 5-cycle data around 350 months post-primary for both solvents, at which time the huff'n'puff design with the longer soaking period overtakes the shorter soaking design.

DETAILED DESCRIPTION

Specific descriptions of the embodiments of the present disclosure or application are illustrative only for the purpose of describing the embodiments, and the embodiments of the present disclosure may be implemented in various forms and should not be construed as being limited to embodiments described in this disclosure or application.

The embodiments of the present disclosure may be variously modified and may have various forms, so that specific embodiments will be illustrated in the drawings and be described in detail in this disclosure or application. It should be understood, however, that it is not intended to limit the embodiments according to the concept of the present invention to specific disclosure forms, but it includes all modifications, equivalents, and alternatives falling within the spirit and scope of the invention.

Hereinafter, preferred embodiments of the present disclosure will be described in detail with reference to the accompanying drawings.

Figure 1:
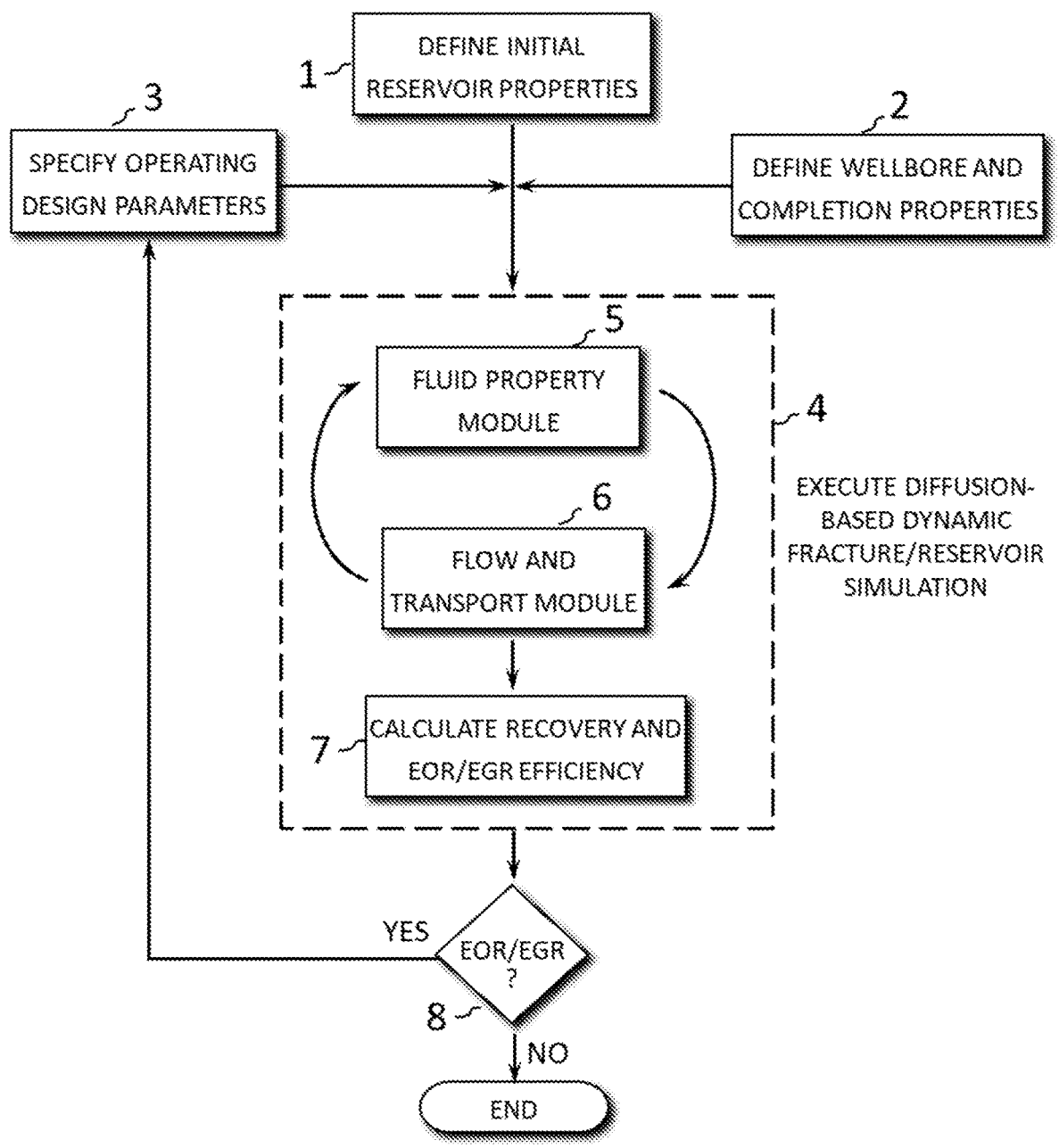
FIG. 1 is a flowchart detailing processes and procedural steps involved in practical application of the invention, which is a specific set of instructions defining a real-world implementation of the physical actions improving hydrocarbon recovery according to one aspect of the present disclosure.
Figure 2:
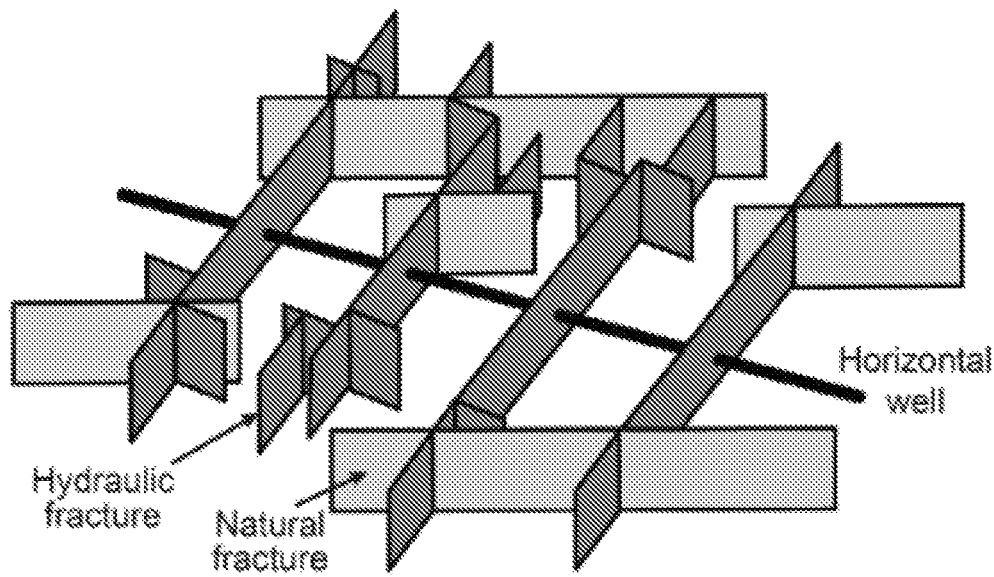
FIG. 2 is a schematic illustrating multiply-fracture horizontal well (MFHW) connected to a network of natural and stimulated fractures according to one aspect of the present disclosure.

FIG. 1 is a flowchart detailing processes and procedural steps involved in practical application of the invention, which is a specific set of instructions defining a real-world implementation of the physical actions improving hydrocarbon recovery according to one aspect of the present disclosure.

Step 1. DEFINE INITIAL RESERVOIR PROPERTIES: This step entails the definition of initial reservoir properties; pressure, temperature, thickness, porosity, depth, fluid saturations and compositions, and the integration of any and all reservoir characterization data (including but not limited to core analysis, mechanical properties, well logs, geologic concepts, etcetera).

Step 2. WELLBORE AND COMPLETION: This step entails defining the wellbore trajectory for each well(s) and all parameters associated with the completion/reservoir stimulation design. Key parameters include well spacing, completed lateral length, properties of the stimulated (natural and induced) fracture network, and best technical estimates for saturation, fracture spacing, and fracture orientations in the subsurface.

Step 3. SPECIFY OPERATING DESIGN PARAMETERS: This step entails the definition of operating conditions for the current development cycle. The zeroth cycle (n=0) is primary production. Any subsequent huff'n'puff cycle is identified by integer increments (n=1, 2, 3, . . . ).
   a. Primary Production Conditions: Primary production operating constraints define the management of bottom-hole-pressure (BHP), surface pressures, and production rates (oil, water, and gas) versus time. The length of primary production is defined for each well(s) within the area of interest along with any primary production enhancements such as re-fracturing.
   b. Huff'n'Puff Conditions: Huff'n'puff operating conditions entail defining the duration of injection (huff), soaking (soak), and production (puff) interval in the current cycle. Conditions include the selection of solvent composition, solvent slug size, and injection constraints (min/max injection rates, compressor pressure, bottom-hole pressure, etcetera). Production constraints during the puff are defined as in Step 3a.

Step 4. EXECUTE DIFFUSION-BASED DYNAMIC FRACTURE/RESERVOIR SIMULATION: This step comprises dynamic simulation of the fracture/reservoir system and the calculation of hydrocarbon recovery and efficiency of the enhanced hydrocarbon process. There is an iterative coupling of the fluid property module and the flow and transport module. The dashed box denotes that the closely related steps 5, 6, and 7 comprise the dynamic simulation process (coupling of fluid properties, transport, and recovery calculations), which is expanded in FIG. 4.

Step 5. FLUID PROPERTY MODULE: In this step, a cubic equation of state (EOS) such as the Peng-Robinson EOS is used to relate thermodynamic variables (pressure, temperature, and compositions) to equilibrium properties of phases (density, saturation, composition). Ancillary properties required in the reservoir evaluation module such as diffusion coefficients and viscosity are also defined here. Fluid properties are used as inputs in the flow and transport module.

Step 6. FLOW AND TRANSPORT MODULE: This step entails the calculation of time-dependent reservoir properties (pressure, temperature, saturation, composition, and geomechanics) and, if applicable, fluid production or injection rates at well(s). Fluid flow within fractures and mass transport within matrix and between matrix and fractures is calculated. Calculations are performed using analytical, semi-analytical, numerical, and/or material balance methods.

Step 7. CALCULATE RECOVERY AND EOR/EGR EFFICIENCY: This step entails the calculation of hydrocarbon recovery during the current cycle or at the conclusion of the current cycle. Calculations are performed using analytical, numerical, and/or material balance methods. The technical and/or economic efficiency of the current Huff'n'Puff cycle for enhanced oil recovery (EOR) or enhanced gas recovery (EGR) is calculated here.

Figure 4:
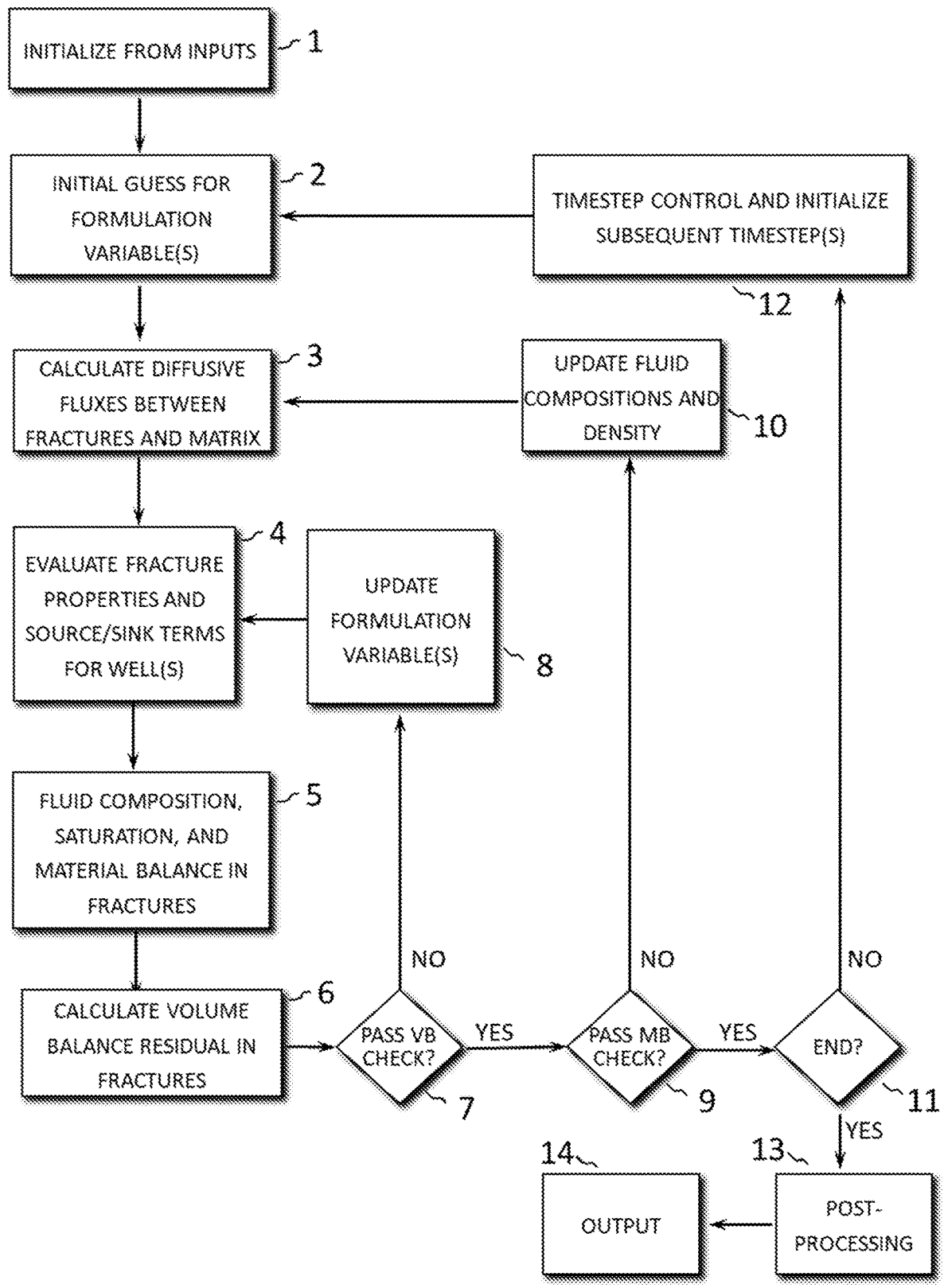
FIG. 4 is a process diagram for the diffusion-based dynamic fracture/reservoir simulation module according to one aspect of the present disclosure.

Step 8. EOR/EGR?: This step entails the decision to commence (n=0) or continue (n=1, 2, 3, . . . ) enhanced oil recovery (EOR) or enhanced gas recovery (EGR) cycles. If the decision is "YES," operating conditions will be defined for the next cycle (n=n+1). If the decision is "NO," development concludes. For example, in the case of huff'n'puff, the tangible outcome is the design parameters including:
Optimal solvent composition
Optimal amount of injected solvent
Optimal injection pressure and temperature
Optimal drawdown pressure during the huff
Quantified injection/production rates and solvent utilization FIG. 4 is a flowchart that outlines steps in the Diffusion-Based Dynamic Fracture/Reservoir Simulation process according to one aspect of the present disclosure.

The diffusion-based semi-analytical simulator (SAS) generates the pressure, composition, and saturations in $V_{wf}$ needed to analytically solve Equation (5) and compute $C_i(x,t)$. Once $C_i(x,t)$ is known, the diffusive flux between matrix and fractures can be calculated based on the concentration gradient at the interface $\partial C_i(0,t)/\partial t$ and recovery factors from cumulative material balance. The SAS is based on an implicit in pressure, explicit in composition (IMPEC) formulation after Acs et al. (1985).

In the semi-analytical simulator, pressure inside the wellbore-fractures ($p_f$) is determined using an iterative Newton-Raphson (NR) scheme based on a volume-balance (VB) condition (Acs, Doleschall, and Farkas 1985) requiring fluid volume and pore volume to be equal in $V_{wf}$. Wong et al. (1990) describe the relationship between VB and NR for compositional simulation. If well production or injection occurs at specified bottom-hole pressure (BHP), the formulation variable becomes mass-rate at the well. Fluid properties and diffusive-fluxes are updated using cup-mixed compositions at the converged pressure with the Peng Robinson (1976) equation of state (PREoS). The effects of elevated capillary pressure and nanopore confinement on phase behavior (Nojabaei, Johns, and Chu 2013) are not considered here. Reservoir temperature is assumed constant. The following can be assumed in the wellbore-fracture volume; negligible capillary pressure, straight-line relative permeability curves, instantaneous cup-mixing and phase equilibrium, and constant isothermal pore volume compressibility. Timestep results are accepted once volume-balance (VB) and material-balance (MB) by component are satisfied.

Step 1. INITIALIZE FROM INPUTS: Starting the simulator by way of FIG. 1.

Step 2. INITIALIZE GUESS FOR FORMULATION VARIABLE(S): Start with guess values for the formulation variable(s) such as pressure and/or mass rate as wells.

Step 3 CALCULATE DIFFUSIVE FLUXES BETWEEN FRACTURES AND MATRIX: The diffusive flux for each component between fractures and matrix is calculated.

Step 4. EVALUATE FRACTURE PROPERTIES AND SOURCE/SINK TERMS FOR WELL(S): Fracture properties and source/sink terms at well(s) are calculated.

Step 5. FLUID COMPOSITION, SATURATION, AND MATERIAL BALANCE IN FRACTURES: Fluid properties, saturations, compositions, and material balance in the fractures are calculated.

Step 6. CALCULATE VOLUME BALANCE RESIDUAL IN FRACTURES: Volume balance is computed within the fractures by comparing the volume of fluid to the available pore volume in fractures.

Step 7. PASS VB CHECK?: Volume balance (VB) check is performed.

Step 8. UPDATE FORMULATION VARIABLE(S): Failure to pass VB check results in an update to formulation variables using Newton-Raphson, by way of example, and not limitation.

Step 9. PASS MB CHECK?: If the VB check is passed, material balance (MB) check is performed.

Step 10. UPDATE FLUID COMPOSITIONS AND DENSITY: Failure to pass MB check results in an update to fluid compositions and densities in fractures.

Step 11 END?: After passing MB checks, the simulation will continue to another timestep ("NO") or it will end ("YES").

Step 12. TIMESTEP CONTROL AND INITIALIZE SUBSEQUENT TIMESTEP(S): If the simulation continues, timestep control is enacted and the simulator is initialized for the subsequent timestep(s).

Step 13. POST-PROCESSING: Post-process calculations including but not limited to, visualization, recovery calculations, incremental calculations, efficiency calculations, and economic calculations.

Step 14. OUTPUT: Results are output by way of FIG. 1.

It should be noted that the computational flowcharts (FIG. 1 and FIG. 4) are merely one example showing how a skilled practitioner could use the concepts described in the invention to make engineering decisions (e.g., forward simulation, history matching) supporting the extraction of hydrocarbon, based on a computational embodiment.

The invention is rooted in tangible, real-world actions, that increase the diffusive flux (and thus overall hydrocarbon recovery) in ultra-tight and unconventional reservoirs. For example, the invention according to aspects of the present disclosure can claim the actual process of hydraulically fracturing reservoirs in such a manner that matrix-fracture contact area is maximized, and if possible, that the fractures have preferred orientations. The invention also claims the physical process of solvent injection, thermal stimulation, and other physical methods of enhancing diffusive flux (and diffusion coefficients) in the reservoir, such as pressure drawdown to enhance the effective density gradients. So, the invention can claim the physical actions to improve diffusion-flux and any computer-based embodiments used to evaluate primary recovery as well as huff'n'puff process.

For better understanding of the present disclosure, reference is now made to the following example calculations demonstrating practical usage of the invention directed towards the prediction and enhancement of hydrocarbon recovery from ultra-tight unconventional reservoirs.

1. Unified Theory of Hydrocarbon Recovery from Ultra-Tight/Unconventional Reservoirs The following example calculation references material from Cronin et al. (in prep), "Unified Theory of Ultimate Hydrocarbon Recovery for Primary and Cyclic Injection Processes in Ultra-Tight Reservoirs."

Theory and Method

Diffusive transport should equilibrate overall compositions at infinite time. Thus, ultimate hydrocarbon mass recovery is strictly a function of the equilibrium hydrocarbon pressure-volume-temperature (PVT) behavior (phase densities, compositions, and saturation) observed at initial (t=0) versus final (t→∞) reservoir conditions. In a reservoir system with $n_c$ components and $n_p$ fluid phases, the ultimate mass recovery factor for each component, $URF_i$ [fraction of original component i mass in place], is, $$URF_i = 1 - C_{i,F}/C_{i,I} = 1 - \sum_{j=1}^{n_p}(S_j\rho_j\omega_{ij})_F \bigg/ \sum_{j=1}^{n_p}(S_j\rho_j\omega_{ij})_I, \quad (1)$$

where $S_j$ [-] is phase saturation, $\rho_j$ [lb/ft$^3$] is phase density, $\omega_{ij}$ [-] is the mass fraction for component i in phase j, $p_I$ [psia] is initial reservoir pressure, $T_{res}$ [° F.] is reservoir temperature, $\vec{z}_I = [z_1, z_2, \ldots, z_n]_I$ [mole fraction] is a composition vector specifying mole fractions for each component, ($z_i$ [-]) subject to $\Sigma_i^{n_c} z_i = 1.0$, $C_{i,I}$ [lb/ft$^3$] is the total mass concentration for component i in the pore space at the initial reservoir conditions ($T_{res}$, p=$p_I$, $\vec{z}_I$, t=0)$_I$, and $C_{i,F}$ [lb/ft$^3$] is the concentration corresponding to final conditions following production at specified pressure, $p_{wf}$ [psia], where ($T_{res}$, p=$p_{wf}$, $\vec{z}_F$, t→∞)$_F$. Subscripts I and F refer to initial and final reservoir conditions, subscript j refers to the phase, and subscript i refers to the component. Equation (1) allows for any number of phases to be present at the initial and final conditions in a reservoir with constant temperature ($T_{res}$ [° F.]), constant pore volume, a spatially uniform initial pressure distribution, no gravity effects, and no-flux outer boundaries. $URF_i$ is a time-independent calculation based on the hypothetical equilibrium composition, $\vec{z}_F$ [mole fraction], reached as t→∞. However, equation (1) needs a reasonable $\vec{z}_F$ estimate.

Equation (1) is a general equation for URF that applies to primary and/or HnP processes. Equation (1) shows that ultimate recovery for hydrocarbon components will be improved by any process capable of reducing $C_{i,F}$ below the initial reservoir concentration.

Primary recovery results mainly from the density reduction (fluid expansion) that occurs in the reservoir as pressure declines. Thus, increasing the amount of pressure drawdown ($p_I - p_{wf}$) during primary production will increase the ultimate recovery factor (attained after an infinite period of production). Equation (1) is used to estimate the ultimate mass recovery [fraction of original component i mass] following primary production, $URF_{i,P} = 1 - C_{i,P}/C_{i,I}$, where subscript P replaces F to denote "primary". $C_{i,P}$ [lb/ft$^3$] is the mass concentration of component i at equilibrium conditions following an infinitely-long period of production ($T_{res}$, $p_{wf}$, $\vec{z}_P$, t→∞) from the primary production process (subscript P), and the assumption of isothermal conditions and constant pore volume can be continued. $\vec{z}_P = [z_1, z_2, \ldots, z_n]_P$ is the overall equilibrium composition in the reservoir following transient conditions during primary production. $\vec{z}_P$ will be constant through the primary recovery process as long as all components can move coherently through the nm-sized pores. However, filtration (Huseynova and Ozkan 2017), size exclusion (Grathwohl 2012), and adsorption (Grathwohl 2012) effects may selectively hinder component transport within small pores or those lined with organic matter. Chromatographic separation (Freeman, Moridis, and Blasingame 2011) is a separate mechanism that is especially important with tight/shale gas.

Equation (1) can be simplified when the overall composition of the fluid is constant during the primary recovery process and the pressure does not go below the bubble point. Confinement within nanopores suppresses bubble point pressure as a consequence of elevated capillary pressures (Nojabaei, Johns, and Chu 2013) and shifts in component critical properties that shrink the two-phase envelope (Teklu et al. 2014). In this case, the primary ultimate recovery factor, $URF_P$, is controlled by the initial ($\rho_I$) and final ($\rho_F$) fluid density, $URF_P = 1 - \rho_I/\rho_F$.

The huff'n'puff performance for EOR and/or EGR based on incremental ultimate recovery factor $IURF_i$, [fraction of original component i mass], is calculated by, $$IURF_i = URF_{i,H} - URF_{i,P} = (C_{i,P} - C_{i,H})/C_{i,I}. \quad (2)$$

where $C_{i,P}$ [lb/ft$^3$] is the mass concentration of component i at equilibrium primary conditions ($T_{res}$, $p_{wf}$, t→∞)$_P$ from the primary process (subscript P), and the assumption of isothermal conditions and constant pore volume can be continued.

Since $C_{i,I}$ is fixed, $C_{i,P}$ and $C_{i,H}$ are the only terms appearing in $IURF_i$ that can be modified in field applications. $C_{i,P}$ is manipulated using pressure-drawdown to decrease fluid density. However, bottom-hole producing pressure can only be lowered so much due to hydrostatic limitations and operational/economic factors. $C_{i,H}$ can be manipulated using HnP to change the composition of fluids in the reservoir (compositional dilution). Thus, solvent composition, amount of solvent, and pressure drawdown, are the three adjustable factors.

Results and Discussion

Here, changes in primary ultimate recovery factor ($URF_P$) can be evaluated as functions of reservoir composition (n-alkane), reservoir pressure, drawdown pressure, and reservoir temperature for the Eagle Ford as a case study. Next, the analysis for huff'n'puff can be repeated, and the effects of solvent composition and the amount of injected solvent can be included.

The hydrocarbon compositions and PVT windows found in tight/ultra-tight reservoirs may vary within the same play. For example, the South Texas Eagle Ford spans the entire PVT window from dry-gas, wet-gas, retrograde condensate, volatile oil, to black oil with $CH_4$ mole fractions ranging from 72-38% (Whitson and Sunjerga 2012).

First, primary ultimate recovery factor ($URF_P$) values can be analyzed for Eagle Ford compositions ranging from dry gas, lean condensate, rich condensates, to oils reported by Orangi et al. (2011). $T_{res}$ values were [237, 266, 285] ° F. as oil volatility increased, [295, 318, 310, 303] ° F. as condensate richness increased, and 352° F. for dry gas. Whitson and Sunjerga (2012) reported $T_{res}$ values between 250 and 330° F. for similar Eagle Ford fluids. Reservoir conditions ($p_i$=8000 psia) can be standardized to reflect the oil and condensate averages and eliminate all factors unrelated to fluid composition and producing pressure when comparing $URF_P$ values at two different reservoir temperatures (T=235° F., FIG. 5a) and (T=285° F. FIG. 5b). Equivalent hydrocarbon molecular weight, $MW_{eq}=\Sigma z_i MW_i / \Sigma z_i$ [lbm/lbmol], can be used to express fluids as single points in hydrocarbon composition space (the summation excludes non-hydrocarbon components).

Figure 5:
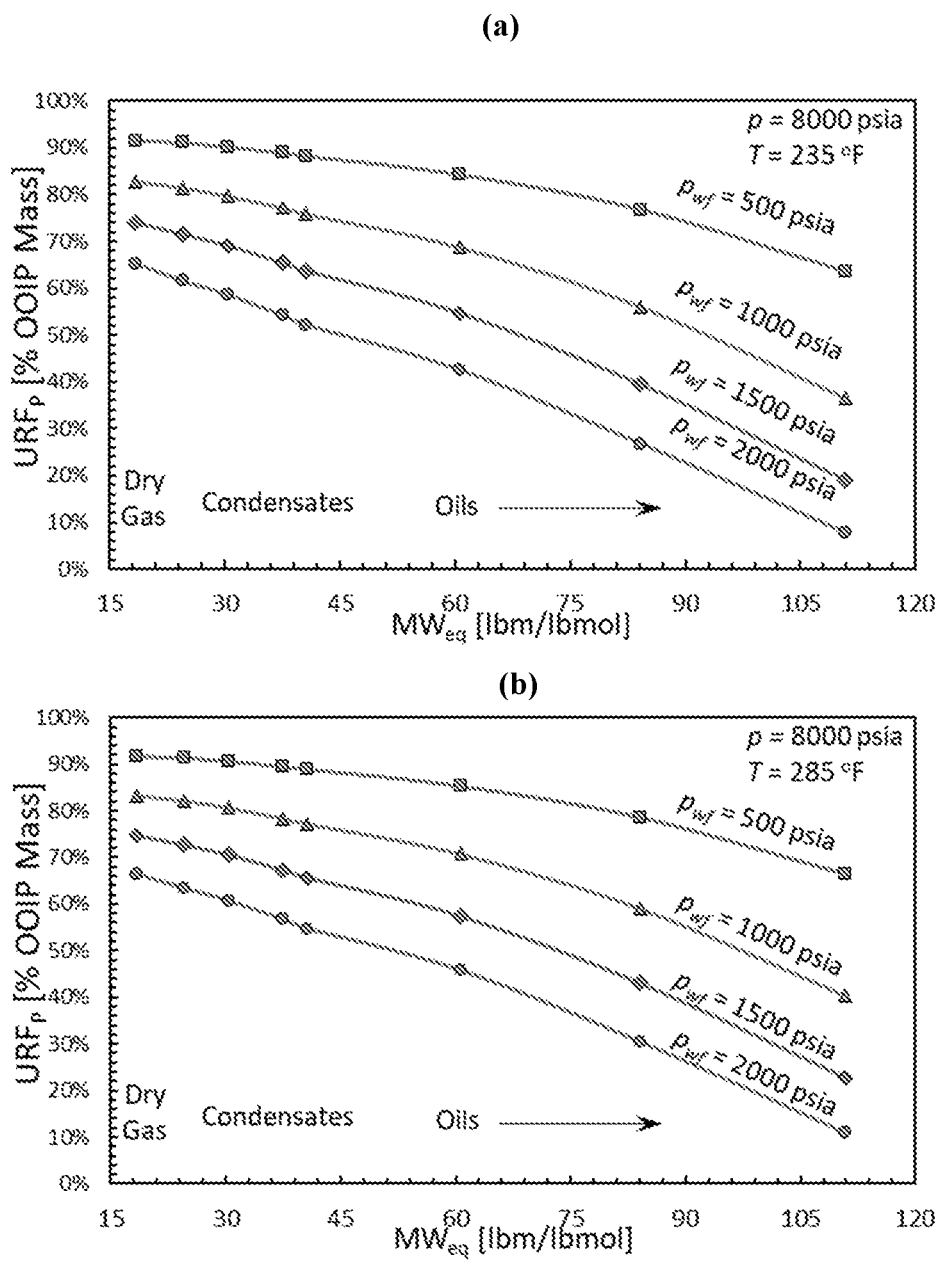
FIG. 5 is a diagram illustrating primary URF [OOIP mass %] versus equivalent hydrocarbon molecular weight, for Eagle Ford compositions (Orangi et al. 2011) for $p_{ref}$=500 psia (squares), 1000 psia (triangles), 1500 psia (diamonds), and 2000 psia (circles). URF values are calculated assuming constant-composition-depletion (CCD) and volumetric behavior and uniform initial pressure ($p_i$=8000 psia) at $T_{res}$=235° F. (a) and $T_{res}$=285° F. (b).

FIG. 5 shows that $URF_P$ values are inversely related to $MW_{eq}$. Recovery improves for all compositions with increasing drawdown ($p-p_{wf}$), but heavier compositions are more sensitive due to lower fluid compressibilities. Practical (time-dependent) recovery factor (RE) values are lower due to preferential production of lighter components, limited production timeframes, and un-accessed reservoir volume. Further, the improved recovery values at higher reservoir temperatures demonstrate the potential for thermal stimulation.

Figure 6:
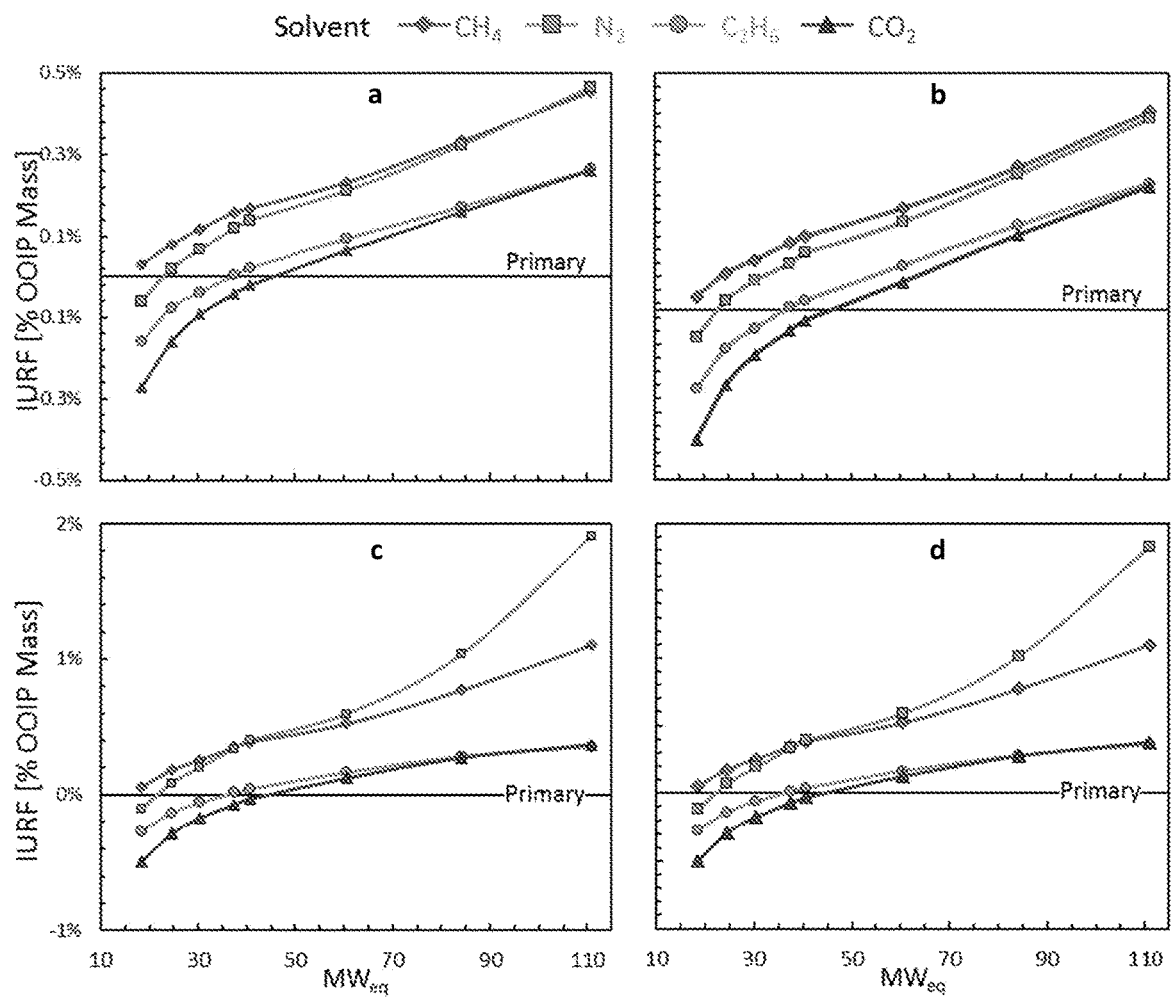
FIG. 6 is a diagram illustrating calculated IURF from primary production ($p_i$=8000 psia, $T_{res}$=285° F., and $p_{wf}$=2000 psia) and HnP for range in Eagle Ford fluid compositions (Orangi et al. 2011) at net solvent mole fractions, $z_s$=1% (a, c) and $z_s$=2% (b, d). The x-axis denotes the equivalent hydrocarbon molecular weight for each reservoir fluid composition (markers). Panels (a) and (b) denote IURF when solvent mixing/production are limited to fluid within fractures ($t_s \to 0$). Panels (c) and (d) show the effect of perfect solvent mixing over the entire reservoir attained as $t_s \to \infty$. Mixing calculation assumes fractures comprise 1% of reservoir pore volume.

Next, the huff'n'puff performance of four different solvent compositions; $CH_4$, $C_2H_6$, $CO_2$, and $N_2$, can be evaluated and compared to improve the URF beyond primary values. Improvement based on incremental ultimate recovery factor IURF, [OOIP mass %] defined in Equation (2) can be expressed. In FIG. 6, incremental URF [OOIP Mass %] for a single cycle of solvent injection can be compared. The effect of solvent mixing/soaking time on incremental LIRE in terms of two conceptual limits can be considered. The first limit assumes perfect mixing in the entire reservoir (as soaking time, $t_s \to \infty$) and constant composition depletion (CCD) conditions during the puff. The second limit assumes that solvent only mixes within fractures ($t_s \to 0$) and the fluid mixture is quickly produced back during the puff.

FIG. 6 shows that some solvents help recovery (IURF>0) while others harm recovery (IURF<0) for a given reservoir composition. $CH_4$ was beneficial to recovery for all Eagle Ford compositions and the heavier MW solvents ($CO_2$ and $C_2$) were generally detrimental for the condensate compositions. $N_2$ benefited almost all compositions but was slightly inferior to $N_2$ for all compositions except the lowest volatility (gas oil ratio (GOR)–500 SCF/STB) oil.

In general, FIG. 6 shows that IURF improves with net solvent transfer into matrix, which is fully, achieved after perfect mixing. However, FIG. 10 also suggests that HnP is viable (IURF>0) in the no-soak limit for oils with any solvent (whether miscible or immiscible) based on density reduction, provided that the fractures contained sufficient pore volume to make the effort economically worthwhile. Perfect mixing minimizes solvent recycling while fracture-only mixing maximizes it. Solvent recycling is a key concern for gas injection projects in fractured reservoirs with low permeability matrix for both technical and economic reasons (Hoteit and Firoozabadi 2009, Lake et al. 2014). Thus, soak duration would largely be driven by solvent recycling and time-value of production considerations.

2. Analytical Simulator for Diffusion-Dominated Transport in Ultra-Tight Reservoirs The following example calculation references material from Cronin et al. (2018), "Diffusion-Dominated Proxy Model for Solvent Injection in Ultra-Tight Oil Reservoirs."

Theory and Method

First, a conceptual proxy model can be described to represent a complex fracture network in terms of idealized 2-D matrix blocks bounded by orthogonal fracture planes and 1-D matrix slabs bounded by parallel fracture planes.

Next, analytical solutions for mass transport from fluid density changes during primary production can be provided, followed by both density and composition changes during solvent huff'n'puff in ultra-tight oil reservoirs using a diffusion-only model for the matrix, and assuming infinite conductivity fractures.

Microseismic mapping and hydraulic fracture growth models indicate complex fracture geometries are developed in-situ (Dahi-Taleghani and Olson 2014, Zoback 2010) during hydraulic fracture stimulation. Ideally, hydraulic fracture stimulation results in an extensive network of connected fractures (natural and hydraulic). Within a fracture network, individual fractures can intersect at different angle. to the present disclosure will focus on, but not limiting to, the parallel slab and corner end member 1-D and 2-D models.

Figure 7:
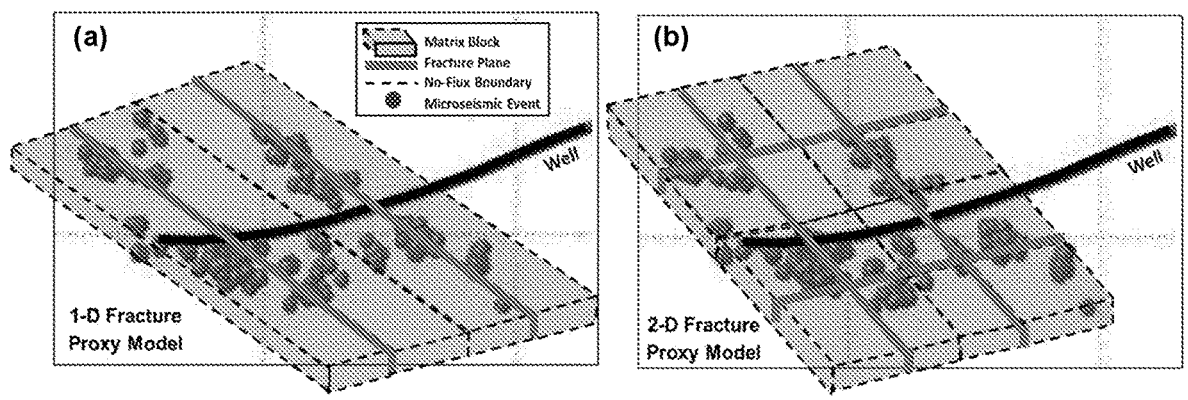
FIG. 7 is a schematic illustrating fracture network map generated from microseismic event data. Elements of symmetry for (a) 1-D and (b) 2-D fracture proxy models overlain on microseismic event data. Proxy models are made to have the same contact area and bulk volume. Fracture network map and proxy models shown arc schematics only (illustrative adaptions of Tezuka et al. (2008) base data).
Figure 8:
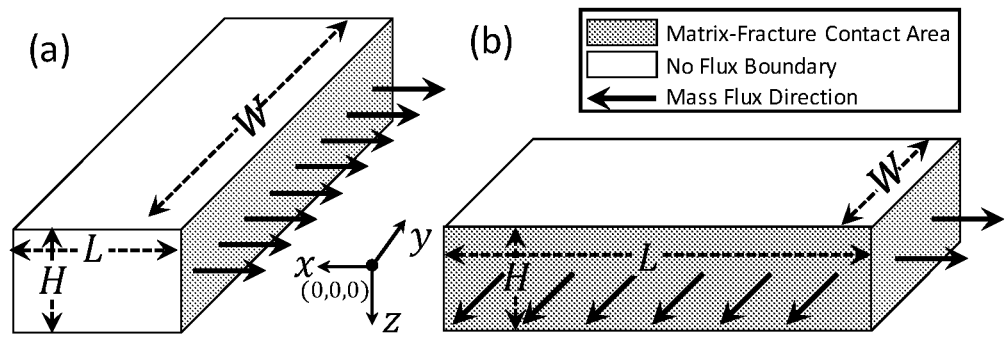
FIG. 8 is close-in view of individual elements of symmetry in 1-D (a) and 2-D (b) network proxy models with equivalent contact area and bulk volume. Fractures have infinite conductivity and flux from matrix into fractures (black arrows) is generally perpendicular to fracture face(s).

FIG. 7 shows two fracture network maps interpreted from example microseismic events for 1-D and 2-D models. The 1-D model considers 1-D transport (x-direction) of solvent from fractures into and within a 3-D matrix block, in which the total matrix-fracture contact area is depicted as a single equivalent fracture plane or as a series of parallel fractures separated by a characteristic spacing (Ozkan et al. 2011). The 1-D fracture proxy model is depicted in FIG. 8a and consists of 1-D symmetry elements (repetitive parallel planar fractures). The 2-D model considers 2-D transport (x- and y-directions) of solvent from fractures into and within a 3-D matrix block. The 2-D model with intersecting fractures provides the simplest way to explore mass transport interference effects in the horizontal plane within the matrix near fracture intersections, while retaining physically plausible matrix block shapes. The 2-D fracture proxy model is schematically depicted in FIG. 8b and consists of 2-D elements of symmetry (repetitive orthogonal planar fractures). Proxy models require a good physical representation of the large-scale fracture network compatible with geologic principles and local reservoir characterization data (e.g. well logs, microseismic, tracers). Furthermore, all proxy models must be constrained by the total contact area between the matrix and fractures and the reservoir bulk volume accessed by the fracture-network. Riazi et al. (1994) explain the importance of conserving matrix-fracture contact area when modeling diffusive mass transfer using simplified matrix block geometries. The 1-D and 2-D linear proxy models both experience boundary dominated effects (BDE) when concentration transients reach block no-flux boundaries (dashed lines in FIG. 7). However, according to one aspect of the present disclosure, only the 2-D model can capture interference.

Fractures are assumed to be infinite conductivity so that flow from the wellbore to the fracture network (or vice versa) is immediate. Thus, injection of solvent into the well mixes everywhere in the fracture volume. According to one aspect of the present disclosure, the "instantaneous system" volume V can be defined to be the total pore volume of the fractures and the volume of the well to the point where the flow rate is determined. The assumption of instant transport in the fractures is a reasonable engineering approximation because the time scale for transport by advection in the fractures is very quick compared to the one by diffusion into the matrix. The production is therefore likely constrained by the matrix. The assumption of infinite conductivity fractures has been made elsewhere for shale oil reservoirs (Patzek, Saputra, and Kirati 2017).

The total compositional balance for a multicomponent multiphase mixture in porous media with $N_c$ components is (Lake et al. 2014)

$$\frac{\partial W_i}{\partial t} + \vec{\nabla} \cdot \vec{N}_i = R_i \text{ for } i = 1, \ldots, N_c, \quad (3)$$

where $W_i$ is the concentration of component i per bulk volume, $\vec{N}_i$ is the flux vector [mass/area-time] of component i, and $R_i$ is the source term [mass/volume-time]. The accumulation term ($\partial W_i/\partial t$) considers the total mass of component i residing within $N_p-1$ fluid phases and sorbed within the solid phase ($j=N_p$). The source term ($R_i$) includes chemical reactions, interphase transfer, and wells. The mass flux term for each component ($\vec{N}_i$) can be expressed by $$\vec{N}_i = \Sigma_{j=1}^{N_p-1} [\vec{J}_{Cij} + \vec{J}_{Dij}]. \quad (4)$$

where $\vec{J}_{Cij} = \rho_j \omega_{ij} \vec{u}_j$ and $\vec{J}_{Dij} = -\phi S_j \vec{\vec{K}}_{ij} \cdot \vec{\nabla}(\rho_j \omega_{ij})$ are the advective and the hydrodynamic dispersive flux, respectively, subscript ij denotes the component i within phase j, $\omega_{ij}$ is the mass fraction of component i in phase j, $\rho_j$ is the phase mass density, $S_j$ is the phase saturation, $\vec{u}_j$ is the Darcy velocity of each phase, $\vec{\vec{K}}_{ij}$ is the diffusion/dispersion tensor, and $\phi$ is the reservoir porosity. Note that the interstitial velocity, $\vec{v}_j = \vec{u}_j/\phi$, is related to the Darcy velocity.

As written in Equation 4, transport in the matrix is by advection and dispersion. Peclet numbers ($N_{Pe} = vl_c/D$) within an ultra-tight oil reservoir matrix, however, are significantly closer to the "diffusion-only" limit ($N_{Pe}=0$) compared to the "advection-only" limit ($N_{Pe}=\infty$) implying that $\vec{J}_{Cij} \approx 0$ in Eq. 2. For example, TABLE 1 shows calculated $N_{Pe}$ values using parameters representing typical conditions for slimtube MMP experiments, pattern scale floods in conventional oil reservoirs, and for the Cagle Ford ultra-tight oil reservoir. The conventional oil value is only a single illustrative example because mixing is scale-dependent in conventional reservoirs. As shown, $N_{Pe}$ values for an ultra-tight oil matrix ($N_{Pe} \sim 0.02$) are four orders of magnitude smaller than conventional oil reservoirs ($N_{Pe} \sim 30$). These extremely small Peclet numbers mean that mass transport as represented by Darcy's law (advection) is negligible compared to transport by diffusion FIG. 9a illustrates the vital role of NPe on the 1-D displacement composition paths during injection of CO2 into an oil reservoir at MMP. Dynamic miscibility where flow and phase behavior interact is possible at large Me values (dashed paths in FIG. 9a), but does not occur at very small Peclet number (NPe~0, see FIG. 9b) where diffusion dominates mass transport and composition paths are linear on the ternary diagram (along the red dilution line in FIG. 9a) (Lake et al. 2014). Hence, MMP and MCM become irrelevant in tight rocks compared to solvent solubility. First contact miscibility (FCM), however, remains important as the diffusion coefficients will be a function of the amounts and compositions of the phases that form. When the dilution line intersects the two-phase zone, the overall mass transport by diffusion is likely to decrease.

Next, analytical solutions that simulate oil flux from the matrix to fractures during primary oil production (a self-diffusion process), solvent influx from fractures into matrix during the huff and soaking periods (a counter-diffusion process), and solvent with oil flux from matrix to fractures during the puff period (a counter-diffusion process) can be provided. The key assumptions are:

1) Flow within the fractures is rapid compared to matrix transport. Fractures are assumed to be infinitely conductive. Thus, the fluids in the wellbore and fractures are assumed to be well mixed such that any concentration and pressure gradients become small. That is, the bottomhole pressure is the same as the pressure in the fractures, and the mass concentration in the wellbore is the same as the mass concentration in the fractures.
2) Mass transport in matrix occurs by diffusion alone. Advective transport is so slow that it is neglected. The dispersion tensor therefore contains only diagonal element based solely on effective diffusion coefficients D The assumption of Fickian diffusion-only transport within tight matrix blocks (crystalline rocks and shales) in contact with highly-conductive planar fractures is common within the related literature (Grisak and Pickens 1981).
3) Diffusive mass transport within the 3-D matrix block is only in the x-direction for the 1-D model (FIG. 8a) and in x- and y-directions for the 2-D model (FIG. 8b).
4) The 3-D matrix block (with thickness of H, width of W, and length of L) is homogeneous and isotropic. All blocks have the same size.

TABLE 1

Example Péclet number calculations for 1-D single phase and single component transport of $CO_2$ into oil.

| Parameter Description Formation and Fluid Properties | Value Lab[a] | Conventional Oil[b] | Ultra-Tight Oil[c] |
|---|---|---|---|
| Matrix Porosity, $\phi$ [-] | 0.5 | 0.2 | 0.07 |
| Matrix Permeability, k [mD] | $1 \times 10^4$ | $1 \times 10^1$ | $1 \times 10^{-5}$ |
| Fluid Viscosity, $\mu$ [cp] | 2 | 1 | 0.5 |
| Pressure Gradient dp/dx [psi/ft] | −0.1 | −0.5 | −100 |
| Effective Diffusion Coefficient, D [ft$^2$/day][d] | $9 \times 10^{-2}$ | $9 \times 10^{-3}$ | $9 \times 10^{-4}$ |
| Characteristic Length, $l_c$ [ft] | 100 | 10 | 0.1 |
| Velocity and Peclet Number Calculation | | | |
| Velocity (Interstitial), v [ft/day]≈ | 63 | 0.03 | $1.8 \times 10^{-4}$ |
| Peclet Number, $N_{pa}$ [-]≈ | 7000 | 30 | 0.02 |

[a]Data source for slimtube conditions from Elsharkawy et al. (1992)
[b]Data source for conventional oil reservoirs from Ringrose and Bentley (2016)
[c]Data source for Eagle Ford ultra-tight oil reservoir from Siripatrachai et al. (2017)
[d]Diffusion coefficients from Mohebbinia and Wong (2017)

5) The diffusion coefficient is an effective value, and is constant for all components and constant spatially and with time. The effective diffusion coefficient reflects geometric factors like pore shape, irreducible water, and tortuosity in addition to rock-fluid interactions that tend to sharpen fronts, such as adsorption. Partitioning adsorption coefficients are constant.
6) The fluid in the wellbore, fractures, and matrix is always a single-phase uniform hydrocarbon mixture. A single-phase (i.e., hydrocarbon phase) two-component system of oil (as a pseudocomponent) and solvent (e.g. $CO_2$, $N_2$, or $CH_4$) can be considered.
7) Water within the fracture and matrix network is immobile, incompressible, and does not partition into the hydrocarbon phase. Water from fracking fluid can give a positive "skin" and decrease the effective diffusion coefficient. Further, it is likely that water can be evaporated during the huff'n'puff process, which would improve the diffusion coefficient with time. Evaporation is not incorporated, and constant water saturation within the matrix can be assumed.
8) There are no chemical reactions.

For the single-phase (hydrocarbon) two-component (oil and solvent, e.g., $C_{10}$ to and $CO_2$) system under consideration, at a given temperature, the mass density of the hydrocarbon phase ($\rho$) changes with pressure and the mass fraction of solvent ($\omega_s$) and oil ($\omega_o$), where the mass concentrations of solvent ($c_s = \rho\,\omega_s$) and oil ($c_o = \rho\,\omega_o$) sum to the hydrocarbon mass density, $\rho = c_s + c_o$. Therefore, in order to calculate $\rho$, $c_s$, and $c_o$, two equations can be solved simultaneously. Based on these assumptions, Eq. (3) simplifies to $$\frac{\partial C_m}{\partial t} = D\left(\frac{\partial^2 C_m}{\partial x^2} + \frac{\partial^2 C_m}{\partial y^2}\right) \qquad (5)$$

$$\text{subject to} \begin{cases} C_m(x, y, 0) = C_{mi} & 0 \le x \le L,\ 0 \le y \le W \\ \frac{\partial C_m}{\partial x}(L, y, t) = 0 & 0 < y \le W,\ t \ge 0 \\ \frac{\partial C_m}{\partial y}(x, W, C) = 0 & 0 < x \le L,\ t \ge 0 \\ C_m(0, y, t) = C_f(t) & 0 \le y \le W,\ t \ge 0 \\ C_m(x, 0, t) = C_f(t) & 0 \le x \le L,\ t \ge 0 \end{cases},$$

where $C = \rho$ [lb/ft$^3$] or $= c_s$ [lb/ft$^3$], subscript m refers to the matrix, D [ft$^2$/day] the effective diffusion coefficient assumed to be same for both oil and solvent, $C_{mi}$ is $C_m$ at t=0, and $C_f(t)$ is the time-dependent $\rho$ or $c_s$ in the fracture network at the matrix-fracture boundary.

During the "primary production" period, $0 \le t \le t_0$, $c_s=0$ and therefore $\rho = c_o$ (see FIG. 10b) implying that oil diffusion from the matrix to fractures is governed by the density gradient (self-diffusion), where the densities here are a function of temperature and pressure difference ($p_{mi} - p_{f0}$) between matrix at initial conditions, $p_{mi}$, and fractures at the specified producing pressure, $p_{f0}$.

During the "huff" period, $t_0 < t \le t_h$, solvent is injected at a constant rate $q_{inj}$ [ft$^3$/day] so that the pressure increases in the fractures from $p_{f0}$ to $p_{fh}$ (sec FIG. 10a). The pressure can be determined from the volume of the wellbore and fractures $V_{wf} = V_w + V_f$, where the total fracture volume, $V_f$, is typically magnitudes greater than the volume of the wellbore, $V_w$ (Abbasi et al. 2014). The storage coefficient S [ft$^3$/psi] of the system, analogous to well testing, is then given by $S = c_t V_{wf}$, where $c_t$ is the total compressibility of the system. The compressibility can include solvent, oil, water, and other factors such as expansion of the fracture volume. The system storage coefficient can be determined from the early time period of the slope of pressure with time. Thus, if there is a mass transfer by diffusion (counter-diffusion) with a constant rate, $q_{leak}$ (i.e., diffusive constant flux "leakoff") from the fractures to the matrix then, $$\frac{dp}{dt} = \frac{q_{inj} - q_{leak}}{S}. \qquad (6)$$

Based on Eq. (6), one can conclude that the pressure changes are small during the huff period, even if $q_{leak}$ is very small, because S is very large. Although some literature have raised concerns about injectivity into tight reservoirs (Alfarge, Wei, and Bai 2017b), Eq. (6) explains why injectivity is not a problem as evidenced by several pilot tests (Todd and Evans 2016). The volume and number of fractures may increase during the huff, which can be included in S.

During the "soaking" period, $t_h < t \le t_s$, the well is shut-in (q=0) and therefore the pressure in the fractures can be assumed to decrease exponentially from $p_{fh}$ to $p_{fs}$. The pressure remains constant during the "puff" period, $t > t_s$, at the production pressure, $p_{fp}$ (see FIG. 10a). Similar to huff, the transport is based on counter-diffusion during soak and puff.

Based on the pressure profile versus time in the fractures, the primary production, huff, soak, and puff periods using a piecewise continuous function can be provided to specify hydrocarbon density (see FIG. 10b) and solvent concentration (see FIG. 10c) in the fracture network through time. This boundary condition is assumed to be constant during primary production, linear with time for the huff, exponential for the soak, and linear for the puff. That is, $$C_f(t) = \begin{cases} C_{f0} & 0 \le t \le t_0 \\ C_{f0} + (C_{fh} - C_{f0})\dfrac{t - t_0}{t_h - t_0} & t_0 < t \le t_h \\ C_{mi} + (C_{fh} - C_{mi})\exp\!\left(\ln\!\left(\dfrac{C_{fs} - C_{mi}}{C_{fh} - C_{mi}}\right)\dfrac{t - t_h}{t_s - t_h}\right) & t_h < t \le t_s \\ C_{fp} - b(t - t_s) & t_s < t \end{cases}, \qquad (7)$$

where $C_{f0}$ is $\rho > 0$ or $c_s = 0$ during the primary production period, $C_{fh}$ is $\rho$ or $c_s$ at the end of huff, $C_{fs}$ is $\rho$ or $c_s$ within fractures at the end of soaking, $C_{fp}$ is $\rho$ or $c_s$ within fractures at the beginning of the puff period, and b is a constant coefficient during puff (b>0 if C=$\rho$ and b<0 if C=$c_s$). For a set of T, $\rho$, $\omega_s$, and $\omega_o$ there is only one value of hydrocarbon-phase density, which can be calculated using an equation of state (EoS) such as the Peng-Robinson EoS (Peng and Robinson 1976). If the composition of hydrocarbon-phase in fractures is known at t=0, $t_h$, $t_s$, and $t_p$, one can calculate $C_{f0}$, $C_{fh}$, $C_{fs}$, $C_{fp}$, and b using the EoS and subsequently the density and concentration profile in the fractures during primary production, huff, soaking, and puff periods. Each preceding period affects later periods.

Figure 3:
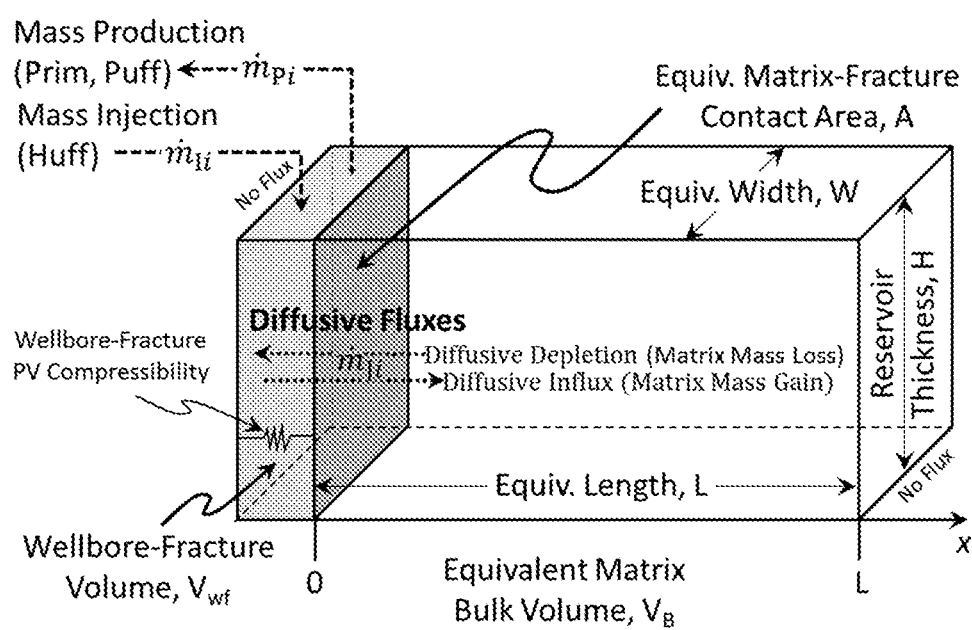
FIG. 3 is a schematic illustrating equivalent 1-D tank-model representation of fractured reservoir system (FIG. 1) used in the diffusion-based semi-analytical simulator. Components enter and leave the wellbore-fracture volume (grey) by injection $\dot{m}_{Ii}$, production $\dot{m}_{Pi}$, and mass-transfers with the equivalent matrix block by diffusion $\dot{m}_{Ji}$ according to one aspect of the present disclosure.

The governing equations are non-dimensionalized by choosing $\Delta C = C_{fh} - C_{mi}$ as the density/concentration scale, the formation thickness H as the reference length scale, and $H^2/D$ as the time scale. Accordingly, $C_D = (C_m - C_{mi})/(C_{fh} - C_{mi})$ can be provided for the mass density of hydrocarbon or mass concentration of solvent, $x_D = x/H$ for x-distance, $y_D=y/H$ for y-distance, and $t_D=Dt/H^2$ for time. Using these scaling groups, the dimensionless governing equation with ICs and BCs for the 1-D system (FIG. 3a) becomes, $$\frac{\partial C_D}{\partial t_D} = \frac{\partial^2 C_D}{\partial x_D^2} \qquad (8)$$

$$\text{subject to} \begin{cases} C_D(x_D, 0) = 0 & 0 \le x_D \le L_D \\ \frac{\partial C_D}{\partial x_D}(L_D, t_D) = 0 & x_D = L_D, t_D \ge 0, \\ C_D(0, t_D) = C_{fD}(t_D) & x_D = 0, t_D \ge 0 \end{cases}$$

and for the 2-D system (FIG. 8b) is $$\frac{\partial C_D}{\partial t_D} = \frac{\partial^2 C_D}{\partial x_D^2} + \frac{\partial^2 C_D}{\partial y_D^2} \qquad (9)$$

subject to $$\begin{cases} C_D(0, x_D, y_D) = 0 & 0 \le x_D \le L_D, 0 \le y_D \le W_D \\ \frac{\partial C_D}{\partial x_D}(L_D, y, t_D) = 0 & 0 < y_D \le W_D, t_D \ge 0 \\ \frac{\partial C_D}{\partial y_D}(x_D, W_D, t_D) = 0 & 0 < x_D \le L_D, t \ge 0 \\ C_D(0, y, t_D) = C_{fD}(t_D) & 0 \le y_D \le W_D, t_D \ge 0 \\ C_D(x_D, 0, t_D) = C_{fD}(t_D) & 0 \le x_D \le L_D, t_D \ge 0 \end{cases},$$

where $L_D=L/H$ and $W_D=W/H$.

The non-dimensional form of the concentration boundary condition, $C_{fD}$, can be written as:

$$C_{fD}(t_D) = \begin{cases} \chi_0 & 0 \le t_D \le t_{0D} \\ \chi_0 + \alpha(t_D - t_{0D}) & t_{0D} < t_D \le t_{hD} \\ \exp(\sigma(t_D - t_{hD})) & t_{hD} < t_D \le t_{sD} \\ \chi_P + \beta(t_D - t_{sD}) & t_{sD} < t_D \end{cases}. \qquad (10)$$

As shown in FIG. 10c and from Eq. (10), the time-dependent boundary condition can be described by seven dimensionless groups:

$$\chi_0 = \frac{C_{f0} - C_{mi}}{C_{fh} - C_{mi}}, \chi_P = \frac{C_{fp} - C_{mi}}{C_{fh} - C_{mi}}, \tau_0 = \frac{t_0}{t_h - t_0}, \tau_h = \frac{t_h}{t_s - t_h} \qquad (11)$$

$$\alpha = \frac{(C_{fh} - C_{f0})H^2}{(C_{fh} - C_{mi})(t_h - t_0)D}, \beta = \frac{bH^2}{(C_{fh} - C_{mi})D},$$

$$\sigma = \frac{H^2}{(t_s - t_h)D} \ln\left(\frac{C_{fs} - C_{mi}}{C_{fh} - C_{mi}}\right),$$

where $t_{0D}=\tau_0(1-\chi_0)/\alpha$, $t_{hD}=(1-\chi_0)(1+\tau_0)/\alpha$, and $t_{sD}=(1-\chi_0)(1+\tau_0)(1+\tau_h)/\alpha\tau_h$.

Using separation of variables and Duhamel's theorem (Carslaw and Jaeger 1986), the solutions to Eqs. (8) and (9) are obtained, which are given in Cronin et al. (2018).

As expected, the 1-D and 2-D solutions (Cronin, Emami-Meybodi, and Johns 2018) indicate that mass flux between matrix blocks and fractures depends on the contact area and the block size. Thus, a 3-D matrix block can be characterized by using block geometry $\psi=HA/V$ and side-length aspect ratio $\gamma=W/L$. For the 2-D transport system, $\gamma$ controls the amount of transient interference for a given bulk volume and contact area, where $\gamma=1$ produces maximum interference while interference vanishes as $\gamma \to 0$ (FIG. 11). As $\gamma \to 0$, transport patterns within matrix become less influenced by the second flux direction and attain a 1-D linear flux profile as shown in FIG. 11.

Before discussing the results, the present disclosure can describe how to construct a proxy model reservoir (as shown in FIG. 7). The first step is to define the total bulk volume and total contact area for the reservoir (global contact area and global bulk volume) accessed by the wellbore-fracture system. The next step is to define the block geometry ($\psi=HA/V$) and flux direction ($\gamma=W\cdot L$) parameters of all individual matrix block elements. Once the individual matrix blocks are uniquely defined ($\psi, \gamma$), the total number of matrix blocks becomes fixed so that the global contact area and bulk volume are conserved after summing over all blocks. For this reason, the total number and size of matrix blocks are different (4 in FIG. 7a, but 16 in FIG. 7b) for the 1-D and 2-D proxy models, respectively, despite having equal contact area and volume. Proxy model construction is iterative because the global values for A and V are themselves unknown exactly. The bulk reservoir volume will be relatively constrained by well spacing, completed lateral length, and mechanical zonation/stratigraphy for the fracture height. One strategy to calculate contact area is to independently constrain the diffusion coefficient value from experiments or theory and then systematically change the 1-D fracture spacing or 2-D block size until calculated production rates reproduce the observed rates.

Results and Discussion

Here, 1-D proxy model can be used to examine oil recovery in a synthetic Eagle Ford and Marcellus plays and illuminate fundamentals governing the primary (self-diffusion) and huff'n'puff (counter-diffusion) processes.

First, the present disclosure can demonstrate how the 1-D solution can be used to obtain oil recovery during the primary production period at which solvent concentration is zero (i.e., $c_s=0$) and the mass density of the hydrocarbon phase is same as the mass concentration of oil (i.e., $\rho=c_o$). During this period only self-diffusion contributes to recovery, not advection. Depletion by diffusion generates the characteristic production profile observed in ultra-tight oil reservoirs, that of high initial production rates followed by a rapid decline and long-lived tail with slowly declining rates (reverse hockey-stick). Accordingly, fluid transport in ultra-tight rock can be a diffusion process that should be modeled based on Fick's law (a diffusion model) instead of Darcy's law. Although, the form of the equations for transport for both Fick's and Darcy's law are similar, the mechanism for depletion is quite different: permeability controls pressure diffusivity in the Darcy's law while diffusion coefficient (D) controls mass diffusivity in Fick's law. This is of critical importance because, unlike permeability, the diffusion coefficient can be enhanced using thermal or solvent methods since molecular movement is proportional to temperature and inversely proportional to density.

FIG. 12 demonstrates that the diffusion-dominated proxy model accurately reproduced the production decline profiles (rate and cumulative) from shale reservoirs in the black oil, gas condensate, and dry gas windows based on a 1-D proxy model with a single hydrocarbon pseudocomponent and constant effective diffusion coefficient. FIG. 12 also demonstrates the difference between time-dependent recovery factors and ultimate recovery factor (URF) values for the primary production process and illustrates the trend of increasing URF values as fluids transition from oil to condensate to gas compositions.

Recovery curves can be provided for primary oil production to illustrate the impact of the matrix block size and shape on recovery. For early time, a semi-infinite matrix block can be considered. Using separation of variables (Carslaw and Jaeger 1986), the solutions for concentration within the matrix and flux (rate, cumulative) at the matrix-fracture interface ($x_D=0$) versus time can be obtained (Cronin, Emami-Meybodi, and Johns 2018). Transient mass flux from a closed system eventually departs from infinite acting behavior (semi-infinite matrix block). The length of the infinite-acting period is inversely proportional to the characteristic ($\psi$) ratio in the system. However, when contact surface area and bulk volume are held constant, 1-D and 2-D transport deviates significantly from the infinite-acting behavior. Transient interference in 2-D systems yields a smooth post-deviation fall-off in rate before boundary effects dominate. In contrast, 1-D systems have a longer infinite acting period followed by a rapid post-deviation fall off due to boundary effects.

Knowing the location and properties of all fractures is impractical under real conditions. Instead, classifying the behavior of a given reservoir between these two conceptual limits; interference-free (1-D parallel) and maximum-interference (2-D orthogonal) can provide a more realistic means of forecasting recovery and evaluating stimulation design efficacy. Reservoirs display interference-dominated behavior when enough fracture intersections are present. Interference reduces mass-transport between matrix and fractures once the system ceases to be infinite-acting. Because total mass-rate is the product of contact area and instantaneous flux (mass/area-time), interference effects in the proxy model reservoir can be represented in terms of a time-dependent effective contact area:

$$A_e(t_D) = f(t_D, \psi, \gamma) A, \quad (12)$$

where $A_e$ is the effective depletion area for an assumed linear transport perpendicular to a straight fracture, A is the original (nominal) contact area, and $f(t_D,\psi,\gamma)=A_e/A$ is a function with values between 1 (early-time infinite-acting period) and 0 (very late-time) that depends principally on block geometry, aspect ratio, and dimensionless time.

$A_e/A$ is calculated by matching mass-rates from a 2-D system to a 1-D system where bulk volume is conserved but contact area is systematically reduced until a match is found. FIG. 13 illustrates how $\gamma$ controls $A_e/A$ versus time prior to the onset of boundary dominated effects (BDE) that occur when concentration transients reach no-flux boundaries for a system with block dimensions $\psi=AH/V=20$. As shown in FIG. 13, during early time ($10^{-6} \leq t_D \leq 4 \times 10^{-5}$), the transport interference continuously reduces the effective contact area, which becomes negligible once $\gamma$ is smaller than ~0.01. At later times ($t_D \geq 10^{-3}$), the boundary effect dominates the transport and significantly reduces the effective contact area. Changing $\psi$ translates the curves in time but does not alter the behavior. The transition occurs gradually for square blocks ($\gamma=1$), which experience maximum interference and as a sharp transition for blocks with predominantly 1-D linear transport ($\gamma<0.1$).

Contact area is beneficial for both the soaking and primary recovery processes. However, knowing the absolute contact area is insufficient to capture dynamic reservoir behavior. Olorode et al. (2013) concluded that planar fractures (corresponding to $A_e/A=1$) yield superior gas production in low-permeability reservoirs compared to non-ideal fracture configurations (non-planar and/or non-orthogonal intersections) based on results from high resolution numerical simulation. Zuloago et al. (2016) also noted that planar fractures yielded better huff'n'puff performance in Bakken simulations than more complicated fracture geometries. These findings conflict with industry's profound enthusiasm for generating "maximum complexity fracture networks" to improve contact area. However, it merely emphasizes the point that fracture network configuration ($A_e/A$) and total contact area (A) must be simultaneously optimized for a given development strategy. Furthermore, solvent slug size and huff'n'puff cycle timing must incorporate how interference reduces concentration gradients (and hence flux) at the matrix-fracture interface.

As discussed previously, total matrix-fracture contact area and diffusion coefficient are related according to the value of the product of A*sqrt(D) needed to match well production rates. The ability to model primary production as a self-diffusion process in the present disclosure requires the in-situ matrix-fracture contact area to be sufficiently large that un-physically large values for diffusion coefficient are not required to match the observed production.

Now, huff'n'puff performance in a shale oil reservoir can be considered based on diffusion-dominated transport, where for simplicity (and not limitation) the hydrocarbon is represented as a two-component (solvent and $nC_{10}$) single-phase fluid with constant effective diffusion coefficient. Real fluid characterizations could also be easily used. Two example cases are considered. TABLE 3 provides a listing of reservoir, fluid, and operational parameters used to compare huff'n'puff recovery performance using $CO_2$ and $CH_4$ as solvents. The operational parameters (cycle duration, injection pressures, etc.) were selected based on scarce fragments of publicly available information on industry huff'n'puff practices in shale oil reservoirs, but where in this paper the soaking period is considered as critical to the process. Prior literature has minimized the soaking period so that production can occur quicker. In both cases considered, it is assumed by matter of example, and not limitation, 36 months of primary production (3 years) preceded the single huff'n'puff cycle (2 years) with 6 months of huff, 2 months of soak, and 14 months of puff, although other durations can be easily used.

During the huff and soak intervals, the oil ($C_{10}H_{22}$) is produced by counter-diffusion from the matrix and enters the fracture system while solvent ($CO_2$ or $CH_4$) simultaneously diffuses into the matrix. Diffusion equalizes concentration gradients with time. The primary production period also impacts recovery by changing the initial density gradient in the matrix at zero time of the huff'n'puff process.

FIG. 14 shows the net flux (rate and cumulative) observed at the well for the hydrocarbon phase, solvent component, and oil component using the operating scheme shown in FIG. 10. Positive flux indicates production and negative flux indicates injection. Oil production rates during the puff are ~2 to 5 times greater than the initial production (IP) value at the start of primary production.

As shown in FIG. 15, $CH_4$ has a greater incremental oil recovery (above primary production alone) for the parameters in Table 2 compared to $CO_2$. This is because $CH_4$ can reduce the density of hydrocarbons within the wellbore-fracture system to a greater extent than $CO_2$ for any given solvent slug size (solvent mass fraction within fractures at the end of the huff). The pronounced reduction in hydrocarbon density within the fractures also explains why the oil production rate at the start of the huff was higher for $CH_4$ than $CO_2$ (see FIG. 14).

TABLE 2

HUFF'N'PUFF scenarios evaluated for soaking time sensitivities with $CH_4$—$nC_{10}$ and $CO_2$—$nC_{10}$ $URF_{HnP}$ = ultimate recovery factor, and $IncURF_{HnP}$ = incremental URF [mass %]. 1 year ≈ 360 days, 1 month ≈ 30 days, 1 week ≈ 7.5 days. Infinite production time values are approximated using t ≈ 70 years following the end of last soak interval. The base solvent injection rate (1.5 MMscf/D) was adjusted to keep the cumulative injection volume constant in all single cycle cases.

| Case | N. of Cycles | Primary | Huff | Soak | Puff | nC10 URF $_{HSP}$ [Mass %] $CH_4$ | nC10 URF $_{HSP}$ [Mass %] $CO_2$ | Nc10 Incremental URF $_{HSP}$ [Mass %] $CH_4$ | Nc10 Incremental URF $_{HSP}$ [Mass %] $CO_2$ | Ultimate Solvent Recycling Factor [Mass %] $CH_4$ | Ultimate Solvent Recycling Factor [Mass %] $CO_2$ |
|---|---|---|---|---|---|---|---|---|---|---|---|
| 1 | 1 | 3 years | 2 weeks | 2 weeks | ∞ | 4.594 | 4.575 | 0.205 | 0.187 | 6.449 | 6.292 |
| 2 | 1 | 3 years | 2 weeks | 6 months | ∞ | 4.596 | 4.580 | 0.208 | 0.190 | 4.782 | 4.733 |
| 3 | 1 | 3 years | 2 months | 2 weeks | ∞ | 4.596 | 4.581 | 0.206 | 0.188 | 5.941 | 5.830 |
| 4 | 1 | 3 years | 2 months | 6 months | ∞ | 4.598 | 4.583 | 0.208 | 0.191 | 4.730 | 4.682 |
| 5 | 1 | 3 years | 2 weeks | ∞ | ∞ | 4.602 | 4.584 | 0.209 | 0.191 | 2.965 | 2.947 |
| 6 | 1 | 3 years | 2 months | ∞ | ∞ | 4.602 | 4.584 | 0.209 | 0.191 | 2.965 | 2.947 |
| 7 | 5 | 3 years | 2 weeks | 2 weeks | 6 mon./∞ | 5.411 | 5.325 | 1.013 | 0.932 | 7.236 | 6.970 |
| 8 | 5 | 3 years | 2 weeks | 6 months | 6 mon./∞ | 5.435 | 5.345 | 1.042 | 0.953 | 5.095 | 4.957 |

The duration of the huff and soaking periods are very important in determining the incremental recovery. A longer injection period (huff) means more mass of solvent is injected. The mass injected however, will be constrained by the maximum compressor pressure that is possible for a given reservoir and well configuration. A longer soaking period is controllable; a longer soak will give more time for gradients to reach equilibrium, and therefore, greater recovery for a single-cycle of solvent injection.

For the cases in FIG. 14, the total mass of oil originally in place the oil produced before the start of the huff are 1.45 billion lb and 22.2 MM lb, respectively. The injected solvent during huff is 30.01 MM lb for $CO_2$ and 21.07 MM lb for $CH_4$. Thus, at the infinite shut-in time, the mass fraction of $CO_2$ and $CH_4$ are 0.021 and 0.015, respectively. Considering these mass fractions and the puff pressure of 1500 psia, the ultimate density of hydrocarbon is 46.3 lb/ft$^3$ for the $C_{10}$—$CO_2$ system and 44.8 lb/ft$^3$ for the $C_{10}$—$CH_4$ system. Using Eq. (20), the ultimate recovery factors for a single huff'n'puff cycle are calculated to be 6.35% for $CO_2$ and 8.78% (mass %) for $CH_4$ (see FIG. 15).

The analysis presented here is based on the mass of produced/injected fluids. Accordingly, the comparison made between $CO_2$- and $CH_4$-huff'n'puff (FIG. 15) is based on the same mass of injected solvent. It is unlikely that field practice will do constant mass injection, but rather a volumetric injection to a maximum surface pressure. Thus, the results presented here for diffusion-dominated transport likely give overly optimistic recovery predictions and may also enhance the recovery by $CH_4$ over $CO_2$. A more predictive model is needed to determine more realistic recovery increases from various solvents, which is discussed in the next example.

3. Multiple-Component, Multiple-Cycle, Simulation for Diffusion-Dominated Transport in Ultra-Tight Reservoirs The following example calculation references material from Cronin et al. (in prep), "A Semi-Analytical Multicomponent Diffusive Model for Cyclic Solvent Injection in Ultra-Tight Reservoirs"

Theory and Method

The semi-analytical simulator (SAS) generates pressure, composition, and saturations in $V_{wf}$ needed to analytically solve the diffusion model discussed in the example 2, and compute $C_i(x,t)$. Once $C_i(x,t)$ is known, the diffusive flux between matrix and fractures can be calculated based on the concentration gradient at the interface $\partial C_i(0,t)/\partial t$ and recovery factors from cumulative material balance. The SAS is based on an implicit in pressure, explicit in composition (IMPEC) formulation after Acs et al. (1985). The flowchart in FIG. 4 outlines steps in the calculation procedure.

In the SAS, pressure inside the wellbore-fractures ($p_f$) is determined using an iterative Newton-Raphson (NR) scheme based on a volume-balance (VB) condition (Acs, Doleschall, and Farkas 1985) requiring fluid volume and pore volume to be equal in $V_{wf}$. Wong et al. (1990) describe the relationship between VB and NR for compositional simulation. If well production or injection occurs at specified bottom-hole pressure (BHP), the formulation variable becomes mass-rate at the well. Fluid properties and diffusive-fluxes are updated using cup-mixed compositions at the converged pressure with the Peng Robinson (1976) equation of state (PREoS). The effects of elevated capillary pressure and nanopore confinement on phase behavior (Nojabaei, Johns, and Chu 2013) are not considered here. Reservoir temperature is assumed constant. The following in the wellbore-fracture volume can be assumed; negligible capillary pressure, straight-line relative permeability curves, instantaneous cup-mixing and phase equilibrium, and constant isothermal pore volume compressibility. Timestep results are accepted once volume-balance and material-balance (MB) by component are satisfied.

Results and Discussion

Here, recovery performance can be evaluated for a series of huff'n'puff design scenarios (solvent selection, cycle frequency, etc.) in a representative unconventional reservoir system. Several cases can be evaluated with only a few fluid components to illuminate fundamental aspects of the huff'n'puff process with respect to soak duration and number of cycles.

Optimizing soaking length in the huff'n'puff process is of the upmost importance because any unnecessary shut-in time will harm project economics. The predictive model in the present disclosure can be used to evaluate eight combinations of huff and soak duration for a single-cycle (cases 1-6) and five-cycle (cases 7-8) huff'n'puff design (TABLE 3).

TABLE 3

Parameters used in the two huff'n'puff examples: $CO_2$—$C_{10}$ and $CH_4$—$C_{10}$.

| Parameter Description | Value | |
|---|---|---|
| Input Data | $CO_2$—$C_{10}$ | $CH_4$—$C_{10}$ |
| Length of Horizontal Well, $L_w$ [ft] | 6000 | 6000 |
| Formation Thickness, H[ft] | 100 | 100 |
| Fracture Half-Length, $x_f$[ft] | 250 | 250 |
| Porosity, $\phi$[-] | 0.1 | 0.1 |
| Effective Diffusion Coefficient, D [ft$^2$/day] | 0.0025 | 0.0025 |
| Initial Reservoir Temperature, T [F] | 230 | 230 |
| Initial Reservoir Pressure, $p_{mi}$ [psia] | 6000 | 5000 |
| Initial Production Pressure, $p_{f0}$ [psia] | 1500 | 1500 |
| Pressure in Fractures at End of Huff, $p_{fh}$ [psia] | 7000 | 7000 |
| Pressure in Fractures at End of Soak, $p_{fs}$ [psia] | 5500 | 5500 |
| Production Pressure during Puff, $p_{fp}$ [psia] | 1500 | 1.500 |
| Solvent Mass Fraction in Fractures at End of Huff, $\omega_{sfh}$ [-] | 0.25 | 0.25 |
| Solvent Mass Fraction in Fractures at End of Huff, $\omega_{sfs}$ [-] | 0.20 | 0.20 |
| Solvent Mass Fraction in Fractures at End of Soak, $\omega_{sfp}$ [-] | 0.15 | 0.10* |
| Solvent Mass Fraction in Fractures at Beginning of Puff, $\omega_{sff}$ [-] | 0.10 | 0.06* |
| End of Primary Production Period, $t_0$ [day] | 1260 | 1260 |
| End of Huff Period, $t_h$ [day] | 1380 | 1380 |
| End of Soaking Period, $t_s$ [day] | 1440 | 1440 |
| End of Puff Period, $t_p$ [day] | 1800 | 1800 |
| Calculated Properties | | |
| Number of Matrix Blocks, NB [-] | 1200 | 1200 |
| Width of Each Block, W [ft] | 500 | 500 |
| Half Length of Each Block, L [ft] | 5 | 5 |
| Height of Each Block, H [ft] | 100 | 100 |
| HC Density at Initial Reservoir Condition, $\rho_{mi}$ [lb/ft$^3$] | 48.4 | 48.4 |
| HC Density in Fractures during Primary Production, $\rho_{f0}$ [lb/ft$^3$] | 46.4 | 46.4 |
| HC Density in Fractures at End of Huff, $\rho_{fh}$ [lb/ft$^3$] | 49.9 | 32.1 |
| HC Density in Fractures at End of Soak, $\rho_{fs}$ [lb/ft$^3$] | 48.8 | 33.4 |
| HC Density in Fractures at Beginning of Puff, $\rho_{fp}$ [lb/ft$^3$] | 45.7 | 24.6* |
| HC Density in Fractures at End of Puff, $\rho_{ff}$ [lb/ft$^3$] | 46.0 | 35.1* |
| Solvent Concentration in Fractures at End of Huff, $c_{sfh}$ [lb/ft$^3$] | 12.48 | 8.02 |
| Solvent Concentration in Fractures at End of Soak, $c_{sfs}$ [lb/ft$^3$] | 9.76 | 6.68 |
| Solvent Concentration in Fractures at Beginning of Puff, $c_{sfp}$ [lb/ft$^3$] | 6.86 | 2.46 |
| Solvent Concentration in Fractures at End of Puff, $c_{sff}$ [lb/ft$^3$] | 4.6 | 2.11 |
| Calculated Dimensionless Groups | | |
| Hydrocarbon {HC}: $x_o$, $x_p$ [-] | -1.3 -1.8 | 0.12, 1.46 |
| Hydrocarbon {HC}: $\tau_u$, $\tau_h$ [-] | 10.5, 23 | 10.5, 23 |
| Hydrocarbon {HC}: $\alpha$, $\sigma$, $\beta$ [-] | 77778, -88117, 2222 | 29243, -5541, -7157 |
| Solvent: $x_o$, $x_p$ [-] | 0, 0.55 | 0, 0.31 |
| Solvent: $\tau_u$, $\tau_h$ [-] | 10.5, 23 | 10.5, 23 |
| Solvent: $\alpha$, $\sigma$, $\beta$ [-] | 33333, -16362, -2008 | 33333, -12230, -490 |

*This is an effective density (saturation weighted density) calculated for the two-phase condition It is found using the predictive model that the time-independent (e.g. "ultimate") recovery factor increases as the combined length of the huff and soaking periods (e.g. total soaking time) increases when holding the injected solvent volume constant. Total solvent recycling also declines with soaking period, which confirms that the recovery mechanism underlying the huff'n'puff process is solvent mass-transfer into matrix such that the global equilibrium mass fraction of solvent within the reservoir increases. On an equal injected volume basis, methane has better density reduction during the puff than carbon dioxide. Density reduction in the fracture improves recovery by increasing the concentration gradient causing oil component to diffuse into the fracture from matrix (Cronin, Emami-Meybodi, and Johns 2018).

Our predictive model results confirm that multiple huff'n'puff cycles are clearly beneficial for both soaking lengths considered (15 days versus 180 days) because the nominal recovery factor (RF) quickly exceeds that of both primary production and the theoretical URF value from the single huff'n'puff cycle (FIG. 16a,b). The undiscounted "break-even" time for the huff'n'puff process corresponds to the length of time following primary production before incremental RF becomes positive. For the five-cycle design (cases 7-8 in Table 3), the break-even time ranges from ~1 month to 12 months for the short and long soak designs respectively (FIG. 16c,d).

When the huff'n'puff process is considered solely through a short-term lens (e.g. a single cycle process over a small number of years), the marginal time-dependent benefit for additional soaking time with respect to incremental recovery is poor. Incredibly long soaks and corresponding puff periods are required to realize recovery factors comparable to the theoretical limits derived from phase behavior. This is revealed by examining recovery factor for $CH_4$ and $CO_2$ in terms of absolute RF versus time (FIG. 16a,b) and incremental RF versus months following primary (FIG. 16c,d). Total soaking time causes incremental recovery to lag relative to shorter soaks for a period of time before yielding a net benefit, i.e. the incremental recovery curves cross-over (FIG. 16c,d). This lag-time is more apparent when viewing recovery factor versus absolute time (FIG. 16a,b) due to the vertical separation between the RF curves at early time.

The present disclosure can claim any process, or plurality of processes, that enhance the diffusion (Fickian or non- Fickian) process underlying hydrocarbon recovery during primary production and enhanced hydrocarbon recovery in ultra-tight unconventional reservoirs. The diffusion process depends on diffusion coefficients, density/concentration gradients, and contact area between matrix and fractures. Present invention enumerates the use of thermal stimulation, solvent injection, and drawdown management to enhance diffusion coefficients, concentration gradients, and density reduction to improve the process of self-diffusion during primary and counter-diffusion during huff'n'puff. Present invention includes hydraulic fracture stimulation techniques that are specifically designed to maximize contact area between matrix and fractures, and, if possible, generate preferential orientations and configuration of the stimulated network of natural and induced fractures.

The present disclosure can be applicable to all hydrocarbon fluid systems spanning the entire natural gas-condensate-oil continuum. Present invention provides a detailed, universal process, to predict and improve hydrocarbon recovery during primary production and/or during EOR/EGR as a function of practical operating conditions, reservoir conditions, and reservoir fluid composition. In addition, the invention provides a detailed procedure to select solvent composition and amount of solvent to best improve hydrocarbon recovery as a function of reservoir fluid composition, reservoir conditions, and practical operating conditions. Present invention provides clear procedural guidance honoring the fundamental physics of hydrocarbon recovery and transport in ultra-tight/unconventional reservoirs such that a skilled practitioner can implement the invention.

The present disclosure can be applicable to the entire reservoir development process. Present invention encompasses the prediction and optimization of hydrocarbon recovery from both primary production and huff'n'puff methods for both chemical and thermal enhanced oil recovery (EOR) and enhanced gas recovery (EGR).

The present disclosure can illustrate that net solvent mass transfer into matrix is essential to the ultimate long-term recovery of hydrocarbon. Further, invention illustrates the method to optimize soak duration.

The present disclosure can illustrate thermal stimulation either by injecting hot solvents/fluids or heating up the reservoir as a process to improve recovery because it enhances the diffusion process.

The present disclosure can illustrate the role of different solvent compositions, and, the intentional selection of solvent compositions based on reservoir conditions and reservoir fluid composition.

The present disclosure can provide clear procedural guidance on the deliberate selection of solvent composition and the amount of solvent injected in one or more discrete cycles based on reservoir properties, reservoir conditions, reservoir fluid composition, and operational constraints.

The present disclosure can claim processes that maximize the contact surface area, fracture configuration (benefits of parallel versus intersecting), that enhance diffusion coefficient, that enhance diffusion flux, all of which are described in our patent document.

The methods described in this disclosure can be tangibly implemented in a non-transitory computer-readable recording medium that stores a program of instructions executable by a computer, a processor, etc. The non-transitory computer-readable recording medium can include each of program instructions, data files and data structures, or a combination of the ones above.

The program of instructions that are written in the non-transitory computer-readable recording medium can be specially designed and configured for the present invention, or can be those available, which are generally understood by those of ordinary skill in the field of computer software. The non-transitory computer-readable recording medium can be, for example, a hard disk, floppy disk, magnetic media such as magnetic tape, CD-ROM, optical media such as DVD, magneto-optical media such as a floptical disk and hardware device such as a ROM, RAM and flash memory, which are configured to store and perform the program of instructions. In addition to the above, the non-transitory computer-readable recording medium can be a program of instructions and a ray of light including a carrier wave that sends a signal specifying the data structure, or can be a transmission medium such as a metal line and waveguide. Examples of the program of instructions can include a machine code, such as those created by a compiler, as well as a high-level language code executable by the computer using an interpreter.

TECHNICAL REFERENCES

Abbasi, Majid Ali, Daniel Obinna Ezulike, Hassan Dehghanpour et al. 2014. A comparative study of flowback rate and pressure transient behavior in multifractured horizontal wells completed in tight gas and oil reservoirs. *Journal of Natural Gas Science and Engineering* 17: 82-93.

Acs, Gabor, Sandor Doleschall, Eva Farkas. 1985. General Purpose Compositional Model. *Society of Petroleum Engineers journal* 25 (04): 543-553. https://doi.org/10.2118/10515-PA.

Adel, Imad A., Francisco D. Tovar, Fan Zhang et al. 2018. The Impact of MMP on Recovery Factor During CO2—EOR in Unconventional Liquid Reservoirs. Proc., SPE Annual Technical Conference and Exhibition, Dallas, Tex., USA, 17.

Albinali, Ali, Erdal Ozkan. 2016. Anomalous Diffusion Approach and Field Application for Fractured Nano-Porous Reservoirs. Proc.

Alfarge, Dheiaa, Mingzhen Wei, Baojun Bai. 2017a. Factors Affecting CO2-EOR in Shale-Oil Reservoirs: Numerical Simulation Study and Pilot Tests. *Energy & Fuels* 31 (8): 8462-8480. http://dx.doi.org/10.1021/acs.energyfuels.7b101623.

Alfarge, Dheiaa, Mingzhen Wei, Baojun Bai. IOR Methods in Unconventional Reservoirs of North America: Comprehensive Review. Society of Petroleum Engineers.

Amann-Hildenbrand, Alexandra, Amin Ghanizadch, Bernhard M. Krooss. 2012. Transport properties of unconventional gas systems. *Marine and Petroleum Geology* 31 (1): 90-99. http://www.sciencedirect.com/science/article/pii/S0264817211002595.

Carlson, Eric S., James C. Mercer. 1991. Devonian Shale Gas Production: Mechanisms and Simple Models. *Journal of Petroleum Technology*.

Carslaw, H. S., J. C. Jaeger. 1986. *Conduction of Heat in Solids,* 2 edition, Oxford University Press (Reprint).

Chen, Kangping and Shen, Di. 2018. US Patent. Systems And Methods For Estimating And Controlling A Production Of Fluid From A Reservoir. US Publication No. 2018/0328168 A1

Cronin, M., H. Emami-Meybodi, R. T. Johns. 2018. Diffusion-Dominated Proxy Model for Solvent Injection in Ultra-Tight Oil Reservoirs. *SPE Journal.* da Silva, F. V., P. Belery. 1989. Molecular Diffusion in Naturally Fractured Reservoirs: A Decisive Recovery Mechanism. Proc.

Dahi-Taleghani, Arash, Jon E. Olson. 2014. How Natural Fractures Could Affect Hydraulic-Fracture Geometry. *SPE Journal* 19 (01): 11.

Darvish, Gholam Reza, Erik G. B. Lindeberg, Torleif Holt et al. 2006. Reservoir Conditions Laboratory Experiments of CO2 Injection into Fractured Cores. Proc., SPE Europec/EAGE Annual Conference and Exhibition, Vienna, Austria.

Eide, Øyvind, Martin A Ferns, Zachary Alcorn et al. 2016. Visualization of carbon dioxide enhanced oil recovery by diffusion in fractured chalk. *SPE Journal* 21 (01): 112-120.

Elsharkawy, A. M., F. H. Poettmann, R. L. Christiansen. 1992. Measuring Minimum Miscibility Pressure: Slim-Tube or Rising-Bubble Method? Proc., SPE/DOE Enhanced Oil Recovery Symposium, Tulsa, Okla.

Fernø, M A, Lars Petter Hauge, A Uno Rognmo et al. 2015. Flow visualization of CO2 in tight shale formations at reservoir conditions. *Geophysical Research Letters* 42 (18): 7414-7419.

Freeman, C. M., G. J. Moridis, T. A. Blasingame. 2011. A Numerical Study of Microscale Flow Behavior in Tight Gas and Shale Gas Reservoir Systems (in English). *Transport in Porous Media* 90 (1): 253-268. http://dx.doi.org/10.1007/s11242-011-9761-6.

Gamadi, T. D., J. J. Sheng, M. Y. Soliman et al. 2014. An Experimental Study of Cyclic CO2 Injection to Improve Shale Oil Recovery. Proc., SPE Improved Oil Recovery Symposium, Tulsa, Okla., USA.

Ghasemi, Mohammad, Wynda Astutik, Sayyed A. Alavian et al. 2017. Determining Diffusion Coefficients for Carbon Dioxide Injection in Oil-Saturated Chalk by Use of a Constant-Volume-Diffusion Method. *SPE Journal* 22 (02).

Grathwohl, P. 2012. *Diffusion in Natural Porous Media: Contaminant Transport, Sorption Desorption and Dissolution Kinetics*, Springer US (Reprint). https://books.google.com/books?id=tpdvBgAAQBAJ.

Grisak, G. E., J. F. Pickens. 1981. An analytical solution for solute transport through fractured media with matrix diffusion. *Journal of Hydrology* 52 (1): 47-57. http://www.sciencedirect.com/science/article/pii/0022169481900950.

Grogan, A. T., V. W. Pinczewski, Gregory J. Ruskauff et al. 1988. Diffusion of CO2 at Reservoir Conditions: Models and Measurements. *SPE Reservoir Engineering*.

Hawthorne, Steven B., Charles D. Gorecki, James A. Sorensen et al. 2013. Hydrocarbon Mobilization Mechanisms from Upper, Middle, and Lower Bakken Reservoir Rocks Exposed to CO2. Proc., PE Unconventional Resources Conference Canada, Calgary, Alberta, Canada.

Hawthorne, Steven B., David J. Miller, Carol B. Grabanski et al. 2017. Measured Crude Oil MMPs with Pure and Mixed CO2, Methane, and Ethane, and Their Relevance to Enhanced Oil Recovery from Middle Bakken and Bakken Shales. Proc., SPE Unconventional Resources Conference, Calgary, Alberta, Canada.

Hoteit, Hussein, Abbas Firoozabadi. 2009. Numerical Modeling of Diffusion in Fractured Media for Gas-Injection and -Recycling Schemes. *SPE Journal*.

Huseynova, Jamila, Erdal Ozkan. 2017. Hindered Transport in Nanoporous Unconventional Reservoirs and Its Implications on IOR and Stimulation. Proc., SPE Annual Technical Conference and Exhibition, San Antonio, Tex., USA.

Kolesar, J. E., Turgay Ertekin, S. T. Obut. 1990a. The Unsteady-State Nature of Sorption and Diffusion Phenomena in the Micropore Structure of Coal: Part 1—Theory and Mathematical Formulation. *SPE Formation Evaluation*.

Kolesar, J. E., Turgay Ertekin, S. T. Obut. 1990b. The Unsteady-State Nature of Sorption and Diffusion Phenomena in the Micropore Structure of Coal: Part 2—Solution. *SPE Formation Evaluation*.

Lake, Larry W, R T Johns, W R Rossen et al. 2014. *Fundamentals of enhanced oil recovery*, 496, Society of Petroleum Engineers (Reprint).

Li, Lei, James J. Sheng. 2016. Experimental study of core size effect on CH4 huff-n-puff enhanced oil recovery in liquid-rich shale reservoirs. *Journal of Natural Gas Science and Engineering* 34: 1392-1402. http://www.sciencedirect.com/science/article/pii/S1875510016305753.

Luo, Peng, Weiguo Luo, Sheng Li. 2017. Effectiveness of miscible and immiscible gas flooding in recovering tight oil from Bakken reservoirs in Saskatchewan, Canada. *Fuel* 208 (Supplement C): 626-636. http://www.sciencedirect.com/science/article/pii/S0016236117308980.

Mohebbinia, Saeedeh, Terry Wong. 2017. Molecular Diffusion Calculations in Simulation of Gasfloods in Fractured Reservoirs. Proc., SPE Reservoir Simulation Conference, Montgomery, Tex., USA.

Morel, D., B. Bourbiaux, M. Latil et al. 1993. Diffusion Effects in Gasflooded Light-Oil Fractured Reservoirs. *SPE Advanced Technology Series* 1 (02): 100-109.

Morteza, Dejam, Hassanzadeh Hassan, Chen Zhangxin. 2017. Pre-Darcy Flow in Porous Media. *Water Resources Research* 53 (10): 8187-8210. https://agpubs.onlinelibrary.wiley.com/doi/abs/10.1002/2017WR021257.

Nojabaci, Baharch, Russell T. Johns, Lifu Chu. 2013. Effect of Capillary Pressure on Phase Behavior in Tight Rocks and Shales. *SPE Reservoir Evaluation & Eng.* 16 (03): 9.

Olorode, Olufemi, Craig M. Freeman, George Moridis et al. 2013. High-Resolution Numerical Modeling of Complex and Irregular Fracture Patterns in Shale-Gas Reservoirs and Tight Gas Reservoirs. *SPE Reservoir Evaluation & Engineering* 16 (04): 443-455.

Olorode, Olufemi M., I. Yucel Akkutlu, Yalchin Efendiev. 2017. Compositional Reservoir-Flow Simulation for Organic-Rich Gas Shale. *SPE Journal* 22 (06): 1,963-1,983.

Orangi, Abdollah, Narayana Rao Nagarajan, Mehdi Matt Honarpour et al. 2011. Unconventional Shale Oil and Gas-Condensate Reservoir Production, Impact of Rock, Fluid, and Hydraulic Fractures. Proc., SPE Hydraulic Fracturing Technology Conference, The Woodlands, Tex., USA, 15.

Ozkan, Erdal, Margaret L. Brown, Rajagopal Raghavan et al. 2011. Comparison of Fractured-Horizontal-Well Performance in Tight Sand and Shale Reservoirs. *SPE Reservoir Evaluation & Engineering* 14 (02): 248-259.

Patzek, Tad W., Frank Male, Michael Marder. 2013. Gas production in the Barnett Shale obeys a simple scaling theory. *Proceedings of the National Academy of Sciences*. http://www.pnas.org/content/early/2013/11/12/1313801.10.abstract.

Patzek, Tadeusz W., Wardana Saputra, Wissem Kirati 2017. A Simple Physics-Based Model Predicts Oil Production from Thousands of Horizontal Wells in Shales. Proc., SPE Annual Technical Conference and Exhibition, San Antonio, Tex., USA.

Peng, Ding-Yu, Donald B. Robinson. 1976. A New Two-Constant Equation of State. *Industrial Engineering Chemistry Fundamentals* 15 (1): 59-64. http://dx.doi.org/10.1021/t160057a011.

Raghavan, R., C. Chen. 2013. Fractional diffusion in rocks produced by horizontal wells with multiple, transverse hydraulic fractures of finite conductivity. *Journal of Petroleum Science and Engineering* 109: 133-143. http://www.sciencedirect.com/science/article/pii/S0920410513002039.

Raghavan, Rajagopal, Chih Chen. 2016. Rate Decline, Power Laws, and Subdiffusion in Fractured Rocks. *SPE Reservoir Evaluation & Engineering*.

Rassenfoss, Stephen. Shale EOR Works, But Will It Make a Difference?, https://www.spe.org/en/jpt/jpt-article-detial/?art=3391 (downloaded Nov. 17, 2017.

Riazi, Mohammad R., Curtis H. Whitson, Flavio da Silva. 1994. Modelling of diffusional mass transfer in naturally fractured reservoirs. *Journal of Petroleum Science and Engineering* 10 (3): 239-253. http://www.sciencedirect.com/science/article/pii/0920410594900841.

Ringrose, Philip, Mark Bentley. 2016. *Reservoir Model Design A Practitioner's Guide*, 245. Dordrecht Heidelberg New York London, Springer (Reprint).

Sheng, James J. 2017. US Patent. Methods For Optimization Of Huff-N-Puff Gas Injection In Shale Reservoirs. US Publication No. 2017/0159416 A1

Sherafati, Marjan, Kristian Jessen. 2018. Coarse-Scale Modeling of Multicomponent Diffusive Mass Transfer in Dual-Porosity Models. Proc., SPE Annual Technical Conference and Exhibition, Dallas, Tex., USA, 14.

Siripatrachai, Nithiwat, Turgay Ertekin, Russell T. Johns. 2017. Compositional Simulation of Hydraulically Fractured Tight Formation Considering the Effect of Capillary Pressure on Phase Behavior. *SPE Journal*.

Solano, R., R. T. Johns, L. W. Lake. 2001. Impact of Reservoir Mixing on Recovery in Enriched-Gas Drives Above the Minimum Miscibility Enrichment. *SPE Reservoir Evaluation & Engineering* 4 (05): 358-365. https://doi.org/10.2118/73829-PA.

Sorensen, James A., Steven B. Hawthorne, Steven A. Smith et al. 2014. *SUBTASK 1.10—CO2 Storage And Enhanced Bakken Recovery Research Program (Final Report Prepared for DOE NEIL Award No. DE-FC26-08NT-43291)*. Grand Forks, N. Dak., USA, University of North Dakota (Reprint). https://www.undeerc.org/bakken/PDFs/JAS-Subtask%201.10%20Revised-Jun14.pdf.

Stalkup, Fred I., Jr. 1983. Status of Miscible Displacement. *J. Petroleum Technology* 35 (04).

Teklu, Tadesse Weldu, Najeeb Alharthy, Hossein Kazemi et al. 2014. Phase Behavior and Minimum Miscibility Pressure in Nanopores. *SPE Reservoir Evaluation & Engineering* 17 (03): 396-403. https://doi.org/10.2118/168865-PA.

Tezuka, Kazuhiko, Ryohei Kamitsuji, Tetsuya Tamagawa. 2008. Fractured Reservoir Characterization Incorporating Microseismic Monitoring and Pressure Analysis During Massive Hydraulic Injection. Proc., International Petroleum Technology Conference, Kuala Lumpur, Malaysia.

Todd, Hoffman B., John G. Evans. 2016. Improved Oil Recovery IOR Pilot Projects in the Bakken Formation. Proc., SPE Low Perm Symposium, Denver, Colo., USA.

Walton, Ian, John McLennan. 2013. The Role of Natural Fractures in Shale Gas Production. Proc., ISRM International Conference for Effective and Sustainable Hydraulic Fracturing, Brisbane, Australia.

Wan, Tao, Yang Yu, James J Sheng. 2015. Experimental and numerical study of the EOR potential in liquid-rich shales by cyclic gas injection. *Journal of Unconventional Oil and Gas Resources* 12: 56-67.

Whitson, Curtis Hays, Snjezana Sunjerga. 2012. PVT in Liquid-Rich Shale Reservoirs. Proc., SPE Annual Technical Conference and Exhibition, San Antonio, Tex., USA, 25.

Wong, Terry W., Abbas Firoozabadi, Khalid Aziz. 1990. Relationship of the Volume-Balance Method of Compositional Simulation to the Newton-Raphson Method. *SPE Reservoir Engineering* 5 (03): 415-422. https://doi.org/10.2118/1842-PA.

Yu, Wei, HainidReza Lashgari, Kamy Sepehrnoori. 2014. Simulation Study of CO2 Huff-n-Puff Process in Bakken Tight Oil Reservoirs. Proc., SPE Western North American and Rocky Mountain Joint Regional MEeting, Denver, Colo., USA.

Yu, Yang, James J. Sheng. 2016. Experimental Evaluation of Shale Oil Recovery from Eagle Ford Core Samples by Nitrogen Gas Flooding. Proc., SPE Improved Oil Recovery Conference, Tulsa, Okla., USA.

Zoback, Mark D. 2010. *Reservoir geoniechanics*, Cambridge University Press (Reprint).

Zuloaga-Molero, Pavel, Wei Yu, Yifci Xu et al. 2016. Simulation Study of CO2-EOR in Tight Oil Reservoirs with Complex Fracture Geometries. *Scientific Reports* 6: 33445. http://dx.doi.org/10.1038/srep33445.

Cronin, M., H. Emami-Meybodi and R. T. Johns (in prep). "Unified Theory of Ultimate Hydrocarbon Recovery for Primary and Cyclic Injection Processes in Ultra-Tight Reservoirs."

Cronin, M., H. Emami-Meybodi and R. T. Johns (in prep). "A Semi-Analytical Multicomponent Diffusive Model for Cyclic Solvent Injection in Ultra-Tight Reservoirs."

Cronin, M., H. Emami-Meybodi and R. T. Johns (2018). "Diffusion-Dominated Proxy Model for Solvent Injection in Ultra-Tight Oil Reservoirs." SPE Journal.

What is claimed is:

1. A method for improved prediction and enhancement of hydrocarbon recovery from ultra-tight unconventional reservoirs for both primary production and any subsequent solvent huff'n'puff periods, comprising steps of:

defining one or more initial properties of a reservoir and integrating characterization data of the reservoir;

defining a wellbore trajectory for each of at least one well and one or more parameters associated with a completion/reservoir stimulation design;

specifying operating conditions for a current development cycle;

performing a diffusion-based dynamic fracture/reservoir simulation for calculating hydrocarbon recovery and efficiency of a hydrocarbon process;

determining whether to commence or continue enhanced oil recovery (EOR) or enhanced gas recovery (EGR) cycles, describing a conceptual proxy model to represent a hydraulic fracture network in terms of idealized two dimensional (2-D) matrix blocks bounded by orthogonal fracture planes and one dimensional (1-D) matrix slabs bounded by parallel fracture planes; and providing analytical solutions for mass transport from fluid density changes during the primary production, followed by both density and composition changes during the subsequent solvent huff'n'puff periods by using a diffusion-based model for a matrix and assuming infinite conductivity fractures; and wherein
the step of performing the diffusion-based dynamic fracture/reservoir simulation includes steps of:
performing an iterative coupling of a step of executing a fluid property module and a step of executing a flow and transport module; and
calculating hydrocarbon recovery during the current development cycle or at an end of current development cycle,
wherein in the step of executing the fluid property module, a cubic equation of state (EOS) is used to relate thermodynamic variables to equilibrium properties of phases, the thermodynamic variables comprising at least one of pressure, temperature, or compositions, the properties of phases comprising at least one of density, saturation, or composition, and
wherein the step of executing the flow and transport module includes calculating time-dependent reservoir properties that includes at least one of pressure, temperature, saturation, composition, geomechanics, fluid production, or injection rates at each of the at least one well.

2. The method of claim 1, wherein the one or more initial properties of the reservoir include at least one selected from the group of a pressure, a temperature, a thickness, a porosity, a depth, fluid saturations and compositions of the reservoir.

3. The method of claim 1, wherein the one or more parameters associated with the completion/reservoir stimulation design include a well spacing, a completed lateral length, properties of a stimulated fracture network, and technical estimates for saturation, a fracture spacing, and fracture orientations in a subsurface.

4. The method of claim 1, wherein the operating conditions for the current development cycle comprise primary production conditions for the primary production and huff'n'puff operating conditions for the subsequent solvent huff'n'puff periods.

5. The method of claim 4, wherein the primary production conditions include management of bottom-hole-pressure (BHP), surface pressures, and production rates versus time.

6. The method of claim 4, wherein the huff'n'puff operating conditions include defining each duration of injection (huff), soaking (soak), and production (puff) interval in the current development cycle, and
the huff'n'puff operating conditions further include selection of solvent composition, solvent slug size, and injection constraints, and
the injection constraints include at least one of min/max injection rates, a compressor pressure, or a bottom-hole pressure.

7. The method of claim 1, wherein the step of executing the fluid property module further includes defining required ancillary properties including diffusion coefficients and viscosity.

8. The method of claim 1, wherein the step of executing the flow and transport module further includes calculating fluid flow within fractures and mass transport within a matrix and between the matrix and the fractures.

9. The method of claim 1, wherein
the mass transport by diffusion is Fickian or non-Fickian,
the mass transport is not minimum miscibility pressure (MMP), but is first-contact miscible (FCM) for dynamic miscibility in the ultra-tight oil and gas shale reservoirs, wherein phase behavior impacts a diffusion coefficient, and
different components have different diffusion coefficient values and different effective density gradients based on a phase within which the components reside, the phase including any one of liquid, vapor, supercritical, or solid.

10. The method of claim 1, wherein diffusion dominates the recovery of the hydrocarbon and non-hydrocarbon components.

11. The method of claim 10, wherein
the diffusion is dependent on several factors, including:
fluid composition, pressure, temperature, and confinement effects, the confinement effects being at least one of altered thermodynamic behavior and transport of species and phases due to presence of species within very small pores and the increased action of component-component, phase-phase, component-rock, and phase-rock interactions.

12. The method of claim 10, wherein the mass transport by the diffusion over any length-scale and time-scale is enhanced.

13. The method of claim 10, wherein the geometry of the proxy model is based on observed micro-seismic events, and a total contact area between fractures and the matrix of the proxy model is equal to that generated by a real network of hydraulic and natural fractures.

14. The method of claim 10, wherein processes that enhance the diffusion include at least one of increasing temperature and increasing an effective density gradient by changes in fluid properties through pressure, temperature, or concentrations.

15. The method of claim 14, wherein the processes in huff'n'puff solvent injection application include actions operating over a timescale that results in changes to pore wall surface properties or geometry of pores such that an effective diffusion coefficient for a species or species is improved, and the changes include at least one of changes in surface wettability or adsorption affinity.

16. The method of claim 15, wherein more soaking leads to greater changes in fluid composition within the matrix, and larger ultimate recovery (recovery at infinite time).

17. The method of claim 16, wherein the diffusion coefficient is a function of temperature, pressure, and phase compositions, and amounts of the phases.

18. The method of claim 17, wherein the diffusion coefficient includes the impact of water left behind from hydraulic fracture stimulation or adsorption, tortuosity, constrictivity, and adverse effects of precipitation, and solids from the reservoirs.

19. The method of claim 14, wherein the processes that enhance the diffusion include a hydraulic fracture stimulation technique that is specifically designed to maximize contact area between fractures and matrix and minimize interference effects through the intentional generation of fractures with preferred orientations and spatial densities.

* * * * *